(12) United States Patent
Kurotsuchi et al.

(10) Patent No.: US 7,859,896 B2
(45) Date of Patent: Dec. 28, 2010

(54) SEMICONDUCTOR DEVICE

(75) Inventors: Kenzo Kurotsuchi, Kodaira (JP);
Norikatsu Takaura, Tokyo (JP);
Yoshihisa Fujisaki, Hachioji (JP)

(73) Assignee: Renesas Electronics Corporation,
Kawasaki (JP)

( * ) Notice: Subject to any disclaimer, the term of this patent is extended or adjusted under 35 U.S.C. 154(b) by 47 days.

(21) Appl. No.: 12/162,702

(22) PCT Filed: Feb. 2, 2006

(86) PCT No.: PCT/JP2006/301794

§ 371 (c)(1),
(2), (4) Date: Jul. 30, 2008

(87) PCT Pub. No.: WO2007/088626

PCT Pub. Date: Aug. 9, 2007

(65) Prior Publication Data

US 2009/0052231 A1 Feb. 26, 2009

(51) Int. Cl.
*G11C 11/00* (2006.01)
(52) U.S. Cl. ............ 365/163; 365/185.18; 365/185.19; 365/158; 365/191; 365/225.5
(58) Field of Classification Search ................ 365/163, 365/185.18, 185.19, 158, 191, 225.5
See application file for complete search history.

(56) References Cited

U.S. PATENT DOCUMENTS

| 3,983,076 | A | | 9/1976 | Rockstad et al. | |
|---|---|---|---|---|---|
| 5,329,486 | A | * | 7/1994 | Lage | 365/145 |
| 5,909,389 | A | * | 6/1999 | Kawakubo et al. | 365/145 |
| 6,639,830 | B1 | * | 10/2003 | Heide | 365/158 |
| 6,693,823 | B2 | * | 2/2004 | Brown | 365/158 |
| 6,775,183 | B2 | * | 8/2004 | Heide | 365/173 |
| 6,829,173 | B2 | * | 12/2004 | Ooishi | 365/185.28 |
| 7,339,233 | B2 | * | 3/2008 | Takahashi | 257/324 |
| 7,379,327 | B2 | * | 5/2008 | Chen et al. | 365/158 |
| 7,443,721 | B2 | * | 10/2008 | Kurotsuchi et al. | 365/163 |
| 7,535,746 | B2 | * | 5/2009 | Kawazoe et al. | 365/148 |

(Continued)

FOREIGN PATENT DOCUMENTS

JP 2004-110867 4/2004

(Continued)

OTHER PUBLICATIONS

2003 Symposium on VLSI Technology Digest of Technical Papers, pp. 175-176.

(Continued)

*Primary Examiner*—Viet Q Nguyen
(74) *Attorney, Agent, or Firm*—Mattingly & Malur, P.C.

(57) ABSTRACT

A semiconductor device for high-speed reading and which has a high data-retention characteristic is provided. In a semiconductor device including a memory array having a plurality of memory cells provided at intersecting points of a plurality of word lines and a plurality of bit lines, where each memory cell includes an information memory section and a select element, information is programmed by a first pulse (reset operation) for programming information flowing in the bit line, a second pulse (set operation) different from the first pulse, and information is read by a third pulse (read operation), such that the current directions of the second pulse and the third pulse are opposite to each other.

8 Claims, 21 Drawing Sheets

U.S. PATENT DOCUMENTS

| | | |
|---|---|---|
| 2004/0051094 A1 | 3/2004 | Ooishi |
| 2004/0233748 A1 | 11/2004 | Terao et al. |
| 2005/0117397 A1 | 6/2005 | Morimoto |
| 2005/0128799 A1 | 6/2005 | Kurotsuchi et al. |
| 2005/0185445 A1 | 8/2005 | Osada et al. |

FOREIGN PATENT DOCUMENTS

| | | |
|---|---|---|
| JP | 2004-289029 | 10/2004 |
| JP | 2005-166210 | 6/2005 |
| JP | 2005-267837 | 9/2005 |
| JP | 3752589 B2 | 12/2005 |

OTHER PUBLICATIONS

ISSCC 2004/Session 2/Non-Volatile Memory/2.1.

* cited by examiner

US 7,859,896 B2

SEMICONDUCTOR DEVICE

TECHNICAL FIELD

The present invention relates to a semiconductor device, and in particular to an effective technique applied to a high-density integrated memory circuit including a memory cell which discriminates stored information items by utilizing a difference among resistances, for example, a memory cell using phase-change material, a logic-embedded type memory including a memory circuit and a logic circuit provided on the same semiconductor substrate, or a semiconductor device having an analog circuit. In particular, the present invention relates to a high-speed and nonvolatile random access memory which operates with a low voltage.

BACKGROUND ART

For example, the growth of a nonvolatile memory market lead by demand for mobile devices, typified by mobile phones, has been significant. A typical example of the nonvolatile memory is a FLASH memory, but since its speed is essentially slow, it is mainly used as a programmable ROM. On the other hand, a high-speed RAM is required as a working memory, and both memories of the FLASH memory and a DRAM are mounted on a mobile device. If an element provided with features of the two memories is realized, it is very impactful not only because it becomes possible to integrate the FLASH memory and the DRAM on one chip but also all the semiconductor memories are replaced.

One of the candidates for realizing such an element is a nonvolatile memory using a phase-change film. A phase-change memory can also be called PRAM, OUM, or ovonic memory. As already known, materials which can be reversibly switched from one phase to another phase is used for the phase-change memory. These phase states can be read out based upon a difference in electrical characteristic between the phase states. For example, these materials can be changed between an irregular state corresponding to an amorphous state and a regular state corresponding to a crystalline state. The amorphous state is higher in electrical resistance than the crystalline state so that information can be memorized utilizing the difference in electrical resistance.

A material suitable for the phase-change memory is an alloy including at least one element of sulfur, selenium, and tellurium, called a chalcogenide. Currently, the most promising chalcogenide is an alloy ($Ge_2Sb_2Te_5$) comprising germanium, antimony, and tellurium, and which has already been widely used in an information memory section of a rewritable optical disc. The chalcogenide is generally often p-type but it may be n-type according to a composition and/or a phase state, as shown in Patent Document 1.

As described above, information storage is conducted utilizing a difference in the phase state of the chalcogenide. The phase change can be obtained by raising a temperature of the chalcogenide locally. Both phases are stable in a temperature range of 70° C. to 130° C., where information is retained. A data retention temperature for 10 years of the chalcogenide depends on its composition but it is generally in a range of 70 to 130° C. When data is retained for 10 years at a temperature exceeding the above temperature, phase change from an amorphous state to a thermodynamically stable crystalline state occurs. When the chalcogenide is retained for a sufficient period of time at a crystallization temperature of 200° C. or higher, a phase thereof changes to a crystalline state. The crystallization time varies depending on the composition of the chalcogenide and/or the temperature to be held. In the case of $Ge_2Sb_2Te_5$, for example, the crystallization time is 150 ns (nanoseconds). In order to change the chalcogenide back to the amorphous state, the temperature of the chalcogenide is raised to a melting point (about 600° C.) or higher and rapidly cooled.

As a temperature-raising method, there is a method which causes current to flow in the chalcogenide to heat the chalcogenide by heat generated from an electrode inside or near the chalcogenide. Hereinafter, crystallizing the chalcogenide of the phase change memory cells is called a set operation, while changing the chalcogenide to an amorphous state is called a reset operation. A state where the phase-change portion has been crystallized is called the "set state", while a state where the phase-change portion has been made amorphous is called the "reset state". A set time is, for example, 150 ns, while a reset time is, for example, 50 ns.

A reading-out method is as follows: the resistance of the chalcogenide is read and information items are identified by applying a voltage to the chalcogenide to measure the current flowing through the chalcogenide. At this time, if the chalcogenide is put in the set state, even if the temperature thereof is raised up to the crystallization temperature, the set state is held since the chalcogenide has been originally crystallized. In case of the reset state, however, information is destroyed. Therefore, the read voltage must be set to a small voltage of, for example, 0.3V so as not to cause crystallization. A feature of the phase-change memory lies in that, since a resistance value of the phase-change portion changes according to a crystalline state or a non-crystalline state in a range of a double-digit value to a triple-digit value and a high side value and a low side value of the resistance value are read out while corresponding to binary information items "0" and "1", the sensing operation is easily facilitated according to an increase of the resistance difference and reading is performed at high speed. Further, multi-value memory can be performed by causing the resistance difference to correspond to ternary or more information. Hereinafter, the reading operation is called a read operation.

Next, the phase-change memory cells based upon the abovementioned will be explained with reference to FIGS. 35 to 37. Note that, FIGS. 35 to 37 show diagrams of a phase-change memory cell which has been examined by the present inventors, FIG. 35 shows a circuit configuration of the phase-change memory cell, FIG. 36 shows a structure thereof, and FIG. 37 shows an operating method thereof.

A phase-change memory cell 111 often comprises an information memory section 113 and a selection transistor 109, but a cross-point type memory cell which does not include a selection transistor is also contemplated. The information memory section 113 includes a chalcogenide 112, and a top electrode 115 and a plug electrode 114 sandwiching the same. Generally, the plug electrode 114 often takes a plug structure having a contact area with the chalcogenide smaller than a contact area of the top electrode 115, but there is such a case where a thin film is used as the electrode, as shown in Non-Patent Document 1.

A common operation of the phase-change memory is described in non-Patent Document 2. The reset operation is performed by raising a word line to apply a current pulse having a pulse width of 20 to 50 ns to a bit line. The set operation is performed by raising a word line to apply a current pulse having a pulse width of 60 to 200 ns to a bit line. The read operation is performed by raising a word line to apply a current pulse having a pulse width of 20 to 100 ns to a bit line. Current pulses used in the reset operation, the set operation, and the read operation flow from a bit line toward a source line in all the operations, as shown in FIGS. 35 to 37, or they flow from the source line to the bit line in all the operations.

In this case, as compared with the set operation where increasing the temperature up to the crystallization temperature is conducted, current larger than that in the set operation is required in the reset operation where heating must be conducted to at least the melting point which is higher than the crystallization temperature. By reducing the reset operation current, an area of a select element is reduced so that high integration of a memory is made possible.

Patent Document 1: U.S. Pat. No. 3,983,076

Non-Patent Document 1: 2003 Symposium on VLSI Technology, pages 175 to 176, Digest of Technical Papers Non-Patent Document 2: 2004 ISSCC, pages 40 to 41, Digest of Technical Papers

DISCLOSURE OF THE INVENTION

Now, the semiconductor memory is generally required to retain data for 10 years in a temperature range of 70 to 120° C. On the other hand, a 10-years data retention temperature of chalcogenide depends on the composition of the chalcogenide but it is generally in a temperature range of 70 to 130° C.

Therefore, in order to conduct the read operation without destroying the information, it is necessary to hold the temperature of the chalcogenide to a temperature equal to or lower than the 10-years data retention temperature even if the read operation is performed. On the other hand, temperature rising up to a high temperature where a phase change occurs in a short period of time at a reprogramming time is performed with an allowable voltage in the semiconductor circuit, for example, 1.5V. Therefore, the voltage which can be used for a read operation must be suppressed to a low voltage such as 0.3V, for example. Thus, such a problem arises that a reading speed lowers.

Since the reset operation current is large, such a problem also arises that the degree of integration is limited.

In view of these circumstances, an object of the present invention is to solve the above problems and provide a technique for realizing a semiconductor device which can perform reading-out at a high speed and has high data retention characteristics.

The above and other objects and novel characteristics of the present invention will be apparent from the description of this specification and the accompanying drawings.

The typical ones of the inventions disclosed in this application will be briefly described as follows.

The present invention is applied to a semiconductor device including a memory array having a plurality of memory cells provided at intersecting points between a plurality of word lines and a plurality of bit lines, each memory cell comprising an information memory section and a select element, where, when programming of information is performed by a first pulse (reset operation) for programming information flowing in a bit line and a second pulse (set operation) different from the first pulse and information is read out by a third pulse (read operation), current directions of the second pulse and the third pulse are opposite to each other.

In the semiconductor device according to the present invention, the information memory section comprises a first electrode of a top electrode, a memory element, a semiconductor material, and a second electrode of a plug electrode, where p-n junction is present in an interface between the memory element and the semiconductor material, or the information memory section comprises a first electrode, a memory element, a dielectric material, and a second electrode, and non-ohmic electric resistance is present in an interface between the memory element and the dielectric material.

The effects obtained by typical aspects of the present invention will be briefly described below.

According to the present invention, a semiconductor device which can conduct high-speed reading-out and has high data retention characteristics can be realized.

BRIEF DESCRIPTIONS OF THE DRAWINGS

BEST MODE FOR CARRYING OUT THE INVENTION

Hereinafter, embodiments of the present invention will be described in detail with reference to the accompanying drawings. Note that, components having the same function are denoted by the same reference symbols throughout the drawings for describing the embodiment, and the repetitive description thereof will be omitted.

(Concept of Embodiments)

Figure 1:
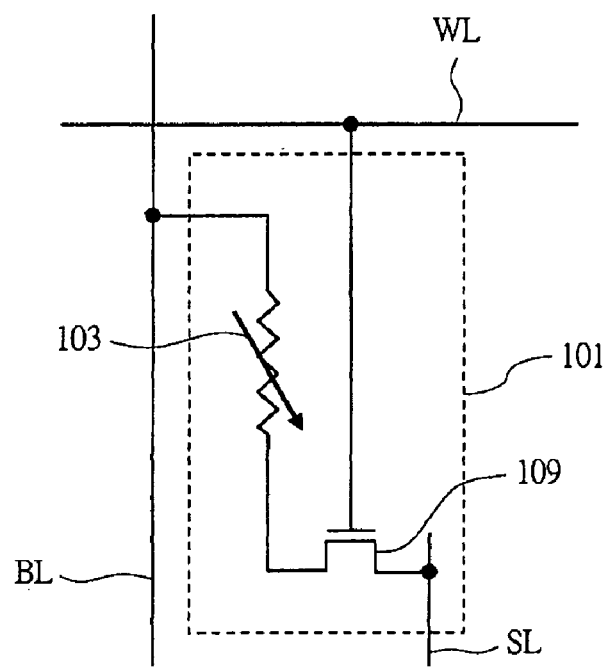
FIG. 1 is a diagram showing a circuit configuration of a phase-change memory cell according to an embodiment of the present invention.
Figure 2:
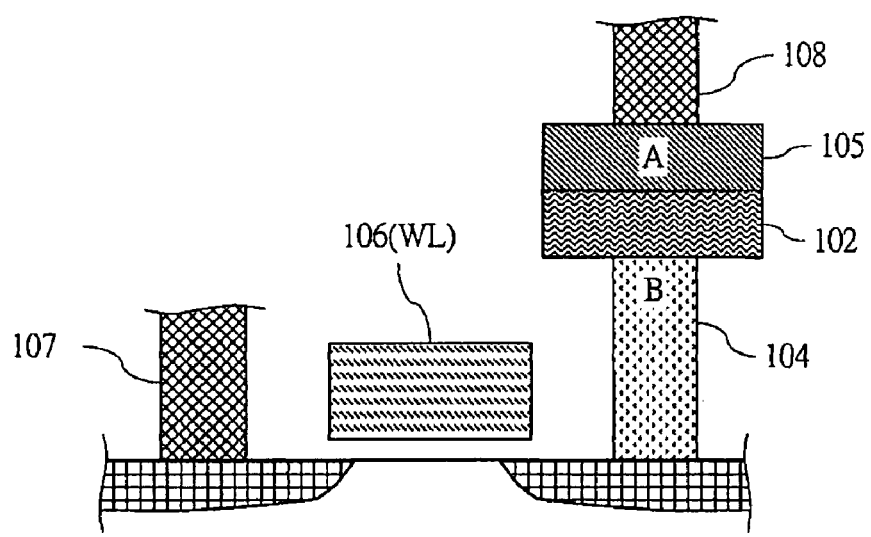
FIG. 2 is a diagram showing a structure of the phase-change memory cell according to the embodiment of the present invention.
Figure 3:
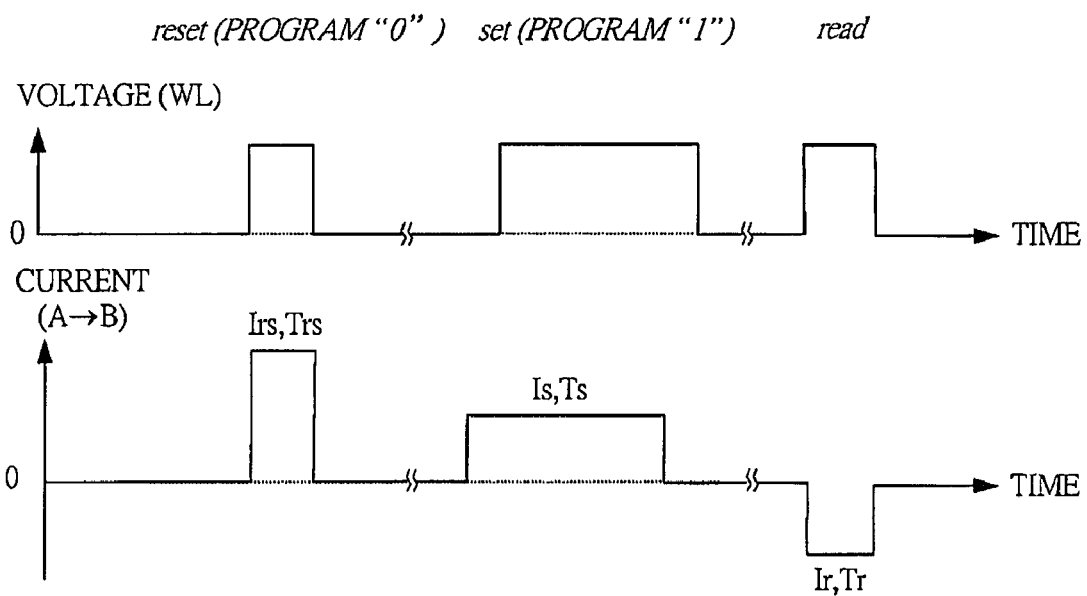
FIG. 3 is a diagram showing an operating method of the phase-change memory cell according to the embodiment of the present invention.

One example of a phase-change memory cell according to an embodiment of the present invention will be explained with reference to FIGS. 1 to 3. FIGS. 1 to 3 are diagrams and a view showing a phase-change memory cell in an embodiment, FIG. 1 is a diagram showing a circuit configuration of the phase-change memory cell, FIG. 2 is a structure thereof, and FIG. 3 is a diagram showing an operating method thereof.

As shown in FIG. 1, a phase-change memory cell 101 comprises an information memory section 103 and a selection transistor (select element) 109. One end of the information memory section 103 is connected to a bit line BL and the other end thereof is connected to the selection transistor 109. The drain of the selection transistor 109 is connected to the information memory section 103, the source thereof is connected to a source line SL, and the gate thereof is connected to a word line WL. As the select element, a MISFET such as a MOSFET, a bipolar transistor, or a junction can be used.

As shown in FIG. 2, in the phase-change memory cell 101, the information memory section 103 has such a structure that a chalcogenide (memory element) 102 is sandwiched between a top electrode (a first electrode) 105 and a plug electrode (a second electrode) 104. As the memory element, a phase-change element (variable resistor) whose resistance value changes according to its crystalline state is used. As the material for the phase-change element, a chalcogenide is used herein. Note that, in FIG. 2, reference numeral 106 denotes a word line (WL), 107 denotes a contact connecting the source line (SL) and the source of the selection transistor 109 to each other, and 108 denotes a contact connecting the bit line (BL) and the top electrode 105 to each other.

As shown in FIG. 3, a reset operation ("0"-programming) is performed by raising the word line (voltage: for example, 1.5V) and applying a current (Irs: for example, 200 μA) pulse having a pulse width of Trs (for example, about 50 ns) to the bit line. A set operation ("1"-programming) is performed by raising the word line (voltage: for example, 1.5V) and applying a current (Is: for example, 100 μA) pulse having a pulse width of Is (for example, about 150 ns) to the bit line. A read operation is performed by raising the word line and applying a current pulse (Ir: for example, 60 μA) having a pulse width of Tr (for example, about 10 ns) to the bit line.

In this case, the set operation is performed by causing current to flow in a direction (A→B) from the top electrode 105 to the plug electrode 104, while the read operation is performed by causing current to flow in a direction (B→A) from the plug electrode 104 to the top electrode 105. When the phase-change memory cell 101 is at least in the reset state, a non-ohmic interface resistance is present between the top electrode 105 or the plug electrode 104 and the chalcogenide 102.

For example, as described in detail later (FIG. 8 and the like), when current is caused to flow in an opposite direction to the non-ohmic interface resistance at the read time, since a voltage drop occurs in the non-ohmic interface resistance, the voltage applied to the chalcogenide 102 lowers. As a result, destruction of the information due to reading is prevented. In the set operation, the drop of voltage in the non-ohmic interface is avoided by causing current to flow in a forward direction of the non-ohmic interface, so that a driving voltage at a set operation time can be reduced.

First Embodiment

One example of a phase-change memory cell according to a first embodiment of the present invention will be explained in detail below with reference to FIGS. 4 to 20.

Figure 4:
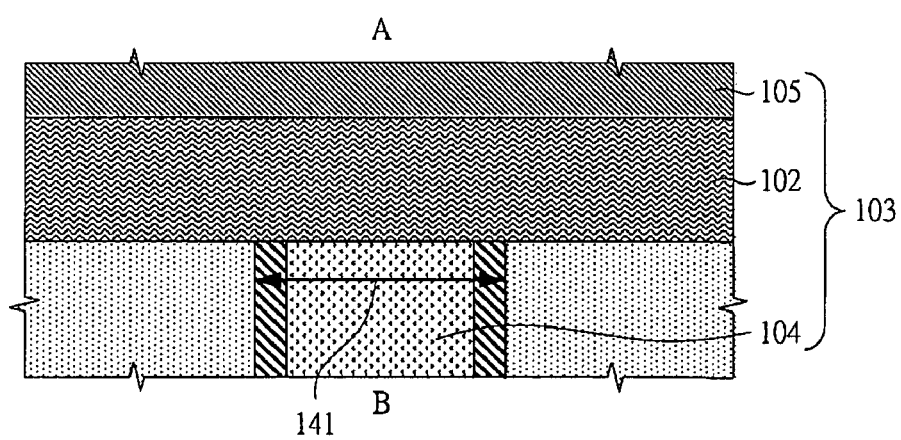
FIG. 4 is a diagram showing a cross-sectional structure of an information memory section in a phase-change memory cell according to a first embodiment of the present invention.

FIG. 4 shows a cross-sectional structure of an information memory section of a phase-change memory cell. In the information memory section 103, the chalcogenide 102 is sandwiched between the top electrode 105 and the plug electrode 104. A composition of the chalcogenide 102 is $Ge_2Sb_2Te_5$, and compositions of the plug electrode 104 and the top electrode 105 are tungsten. A size 141 of the plug electrode 104 is a diameter of 160 nm. Note that, the size 141 of the plug electrode 104 may vary according to generation of a semiconductor process to be used. As a composition of the top electrode 105, tungsten is often used, but other conductive materials can be used as the top electrode.

Figure 5:
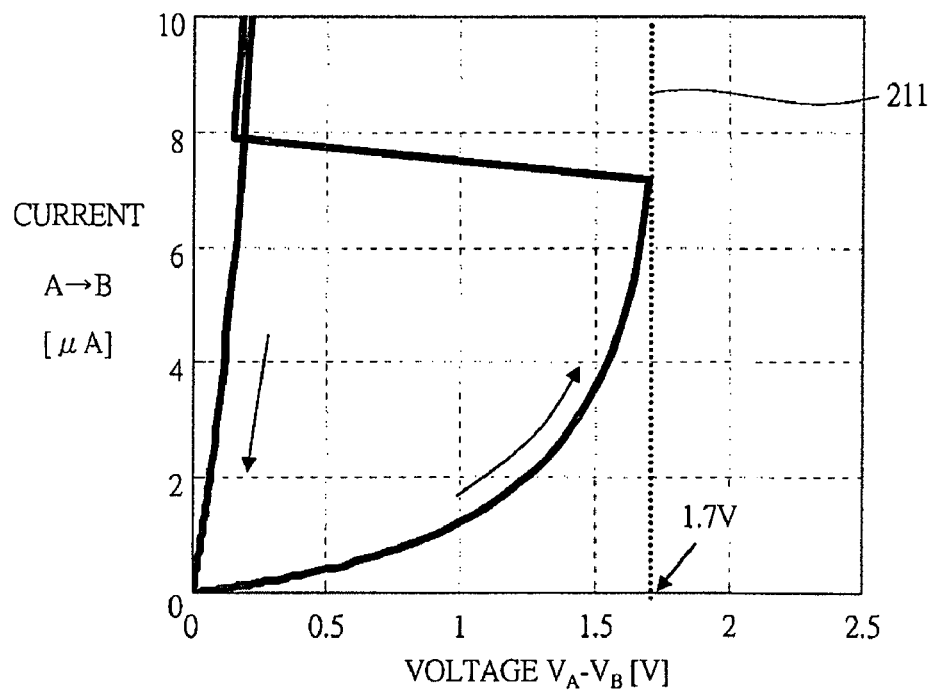
FIG. 5 is a diagram showing a current-voltage waveform obtained when voltage higher than that applied to a plug electrode is applied to a top electrode in the phase-change memory cell according to the first embodiment of the present invention.
Figure 6:
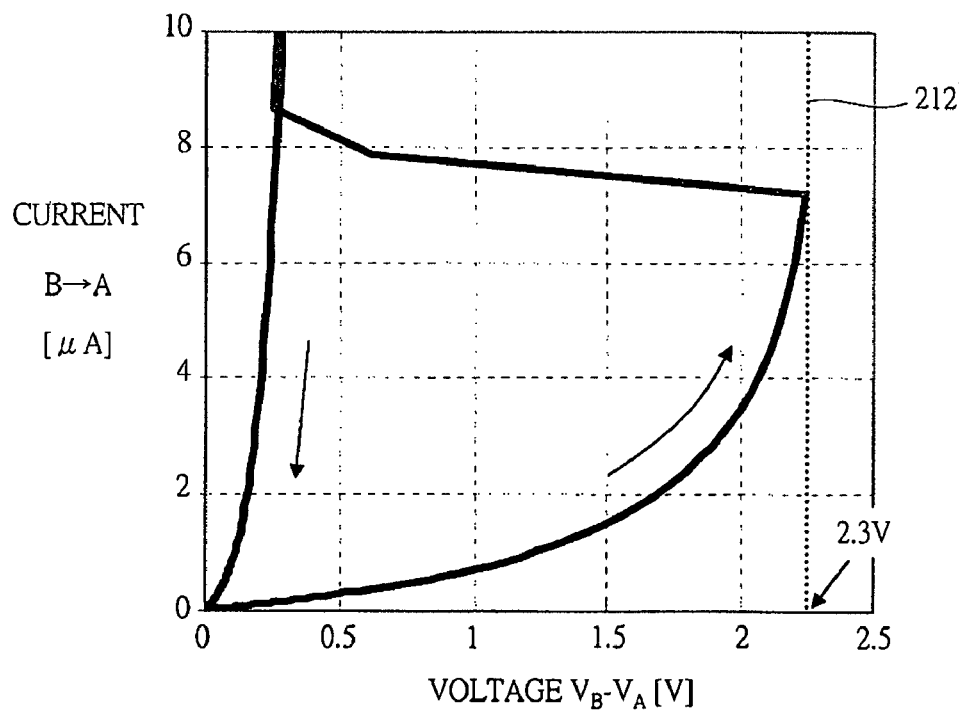
FIG. 6 is a diagram showing a current-voltage waveform obtained when voltage higher than that applied to the top electrode is applied to the plug electrode in the phase-change memory cell according to the first embodiment of the present invention.

Experimental results where current has been caused to flow between the top electrode 105 shown by symbol "A" in FIG. 4 and the plug electrode 104 shown by symbol "B" in FIG. 4 and voltage values between A and B have been measured are shown in FIGS. 5 and 6.

This experiment is performed in the reset state of the information memory section 103. A waveform obtained when a voltage higher than that applied to the plug electrode 104 is applied to the top electrode 105 ($V_A>V_B$), that is, when current is caused to flow from the top electrode 105 to the plug electrode 104 through the chalcogenide 102 is shown in FIG. 5. This experiment shows the following fact. A resistance of the information memory section 103 is calculated by dividing voltage by current. It is understood that, when the applied voltage exceeds 1.7V which is a threshold voltage 211, the resistance of the information memory section 103 lowers rapidly so that the chalcogenide 102 phase-changes from an amorphous state to a crystalline state. That is, it is understood that, when current is caused to flow from the top electrode 105 to the plug electrode 104, the threshold voltage 211 where the set operation is performed is 1.7V.

Next, A waveform obtained when a voltage higher than that applied to the top electrode 105 is applied to the plug electrode 104 ($V_A<V_B$), that is, when current is caused to flow from the plug electrode 104 to the top electrode 105 via the chalcogenide 102 is shown in FIG. 6. In this experiment, it is understood that, when the applied voltage exceeds a threshold voltage 212, the chalcogenide 102 phase-changes from the amorphous state to the crystalline state. At this time, the threshold voltage 212 is 2.3V and it is higher than the threshold voltage 211.

The reason is explained in the following manner. A chalcogenide in an amorphous state is generally a p-type semiconductor. Therefore, a non-ohmic interface resistance is formed in an interface between an electrode and the chalcogenide. The interface resistance configures a Schottky barrier diode when the electrode is made from a metal material. Since a contact area between the chalcogenide 102 and the plug electrode 104 is smaller than that between the chalcogenide 102 and the top electrode 105, influence of the non-ohmic interface resistance becomes large.

Figure 7:
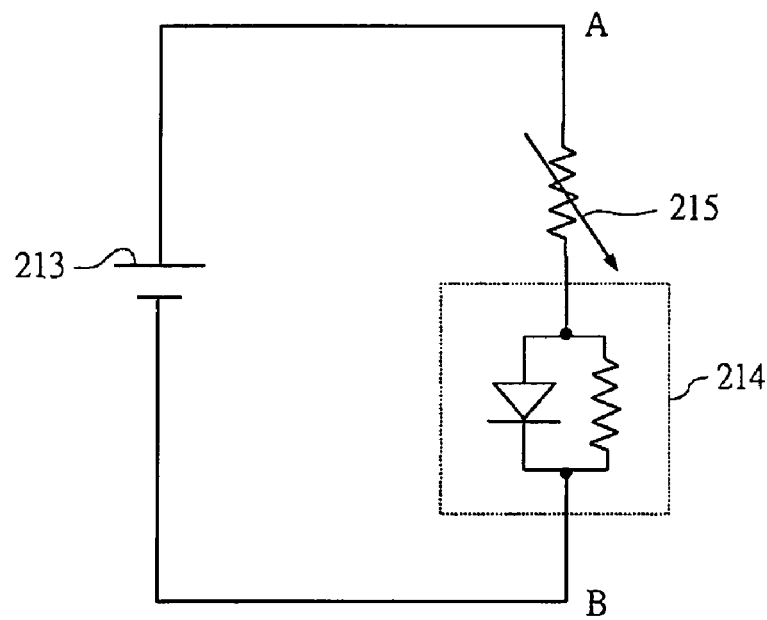
FIG. 7 is a circuit diagram schematically showing the phase-change memory cell according to the first embodiment of the present invention when voltage higher than that applied to a plug electrode is applied to a top electrode.

A circuit diagram when a voltage higher than that applied to the plug electrode 104 is applied to the top electrode 105 ($V_A>V_B$) is schematically shown in FIG. 7. A resistance of the chalcogenide 102 is shown by a circuit symbol 215, and an interface resistance is shown by a circuit symbol 214. The interface resistance has electric characteristic where a diode and a resistor are connected in parallel. Since an application voltage 213 is applied in a forward direction of a diode contained in the interface resistance 214, the interface resistance 214 is a low resistance and almost all of the application voltage 213 is applied to a resistance 215 of the chalcogenide.

Figure 8:
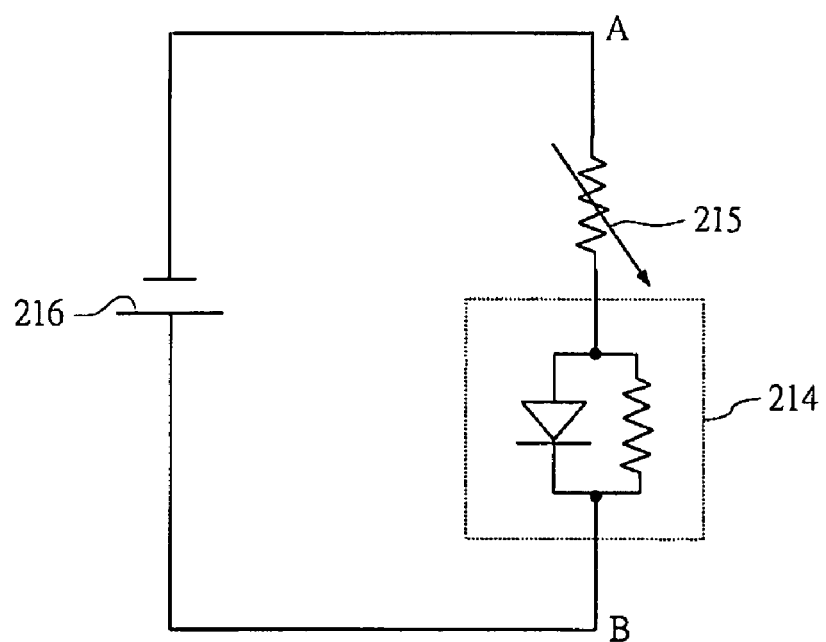
FIG. 8 is a circuit diagram schematically showing the phase-change memory cell according to the first embodiment of the present invention when voltage higher than that applied to the top electrode is applied to the plug electrode.

A circuit diagram when voltage higher than that applied to the top electrode 105 is applied to the plug electrode 104 ($V_A<V_B$) is schematically shown in FIG. 8. In this case, since a voltage is applied in a backward direction to the diode contained in the interface resistance 214, the interface resistance 214 is a high resistance. Therefore, application voltage 216 is applied separately to the resistance 215 of the chalcogenide and the interface resistance 214. Accordingly, voltage applied to the resistance 215 of the chalcogenide becomes low.

Figure 9:
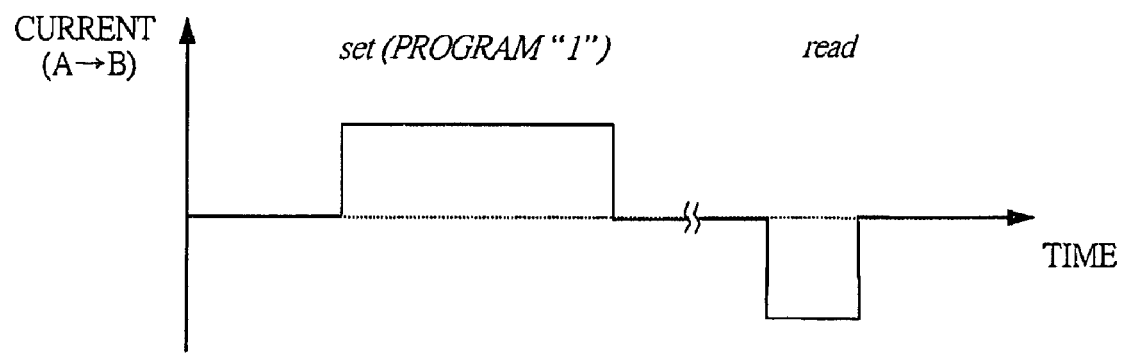
FIG. 9 is a diagram showing influences imparted to a set operation and a read operation of an information memory section by current directions in the phase-change memory cell according to the first embodiment of the present invention.

From the above, as shown in FIG. 9, the read operation is performed by causing current to flow from the plug electrode 104 to the top electrode 105 so that destruction of information can be prevented. The set operation is performed by causing current to flow from the top electrode 105 to the plug electrode 104 so that the set voltage can be reduced to a low voltage. According to kinds of chalcogenide materials, current or voltage used for the set operation or the reset operation can be made lower than those used for the read operation. As a result, the read operation can be made high speed.

An NMOSFET has such a feature that a driving current thereof is larger than that for a PMOSFET. When the NMOSFET is used as the selection transistor 109, the reset operation is performed by causing current to flow from the top electrode 105 to the plug electrode 104, as shown in FIGS. 1 to 3, so that the following effect can be obtained. Since a source voltage of the NMOSFET can be made equal to a potential of the source line SL, a voltage between the gate and the source becomes large. Therefore, an area of the NMOSFET required to obtain the same reset current can be reduced. If current is caused to flow from the plug electrode 104 to the top electrode 105, a voltage drop occurs in the information memory section 103, so that the source potential of the NMOSFET becomes higher than the potential of the source line SL. Therefore, the driving ability of the NMOSFET lowers.

When a non-ohmic resistance is formed between the chalcogenide 102 and the plug electrode 104, such a merit can be obtained that a reading signal is amplified. As understood from FIGS. 5 and 6, this is because an interface resistance between the plug electrode and the chalcogenide in an amorphous state is generally larger than that between the plug electrode and the chalcogenide in a crystalline state so that when the information memory section 103 is in the reset state, the resistance increases due to the presence of the interface resistance, but when the information memory section 103 is in the set state, the resistance hardly changes so that a resistance ratio of the set state and the reset state becomes large and a reading signal becomes large. As a result, high-speed reading is made possible.

Next, when the contact area between the top electrode 105 and the chalcogenide 102 is equal to that between the plug electrode 104 and the chalcogenide 102, a current direction suitable for the set operation and a current direction suitable for the read operation can be made different by making material for the top electrode 105 and material for the plug electrode 104 different from each other. Further, non-destructive reading can be performed using a pulse having a voltage amplitude or current amplitude larger than that of a pulse used for the set operation by reversing current directions of the set operation and the read operation to each other.

Figure 10:
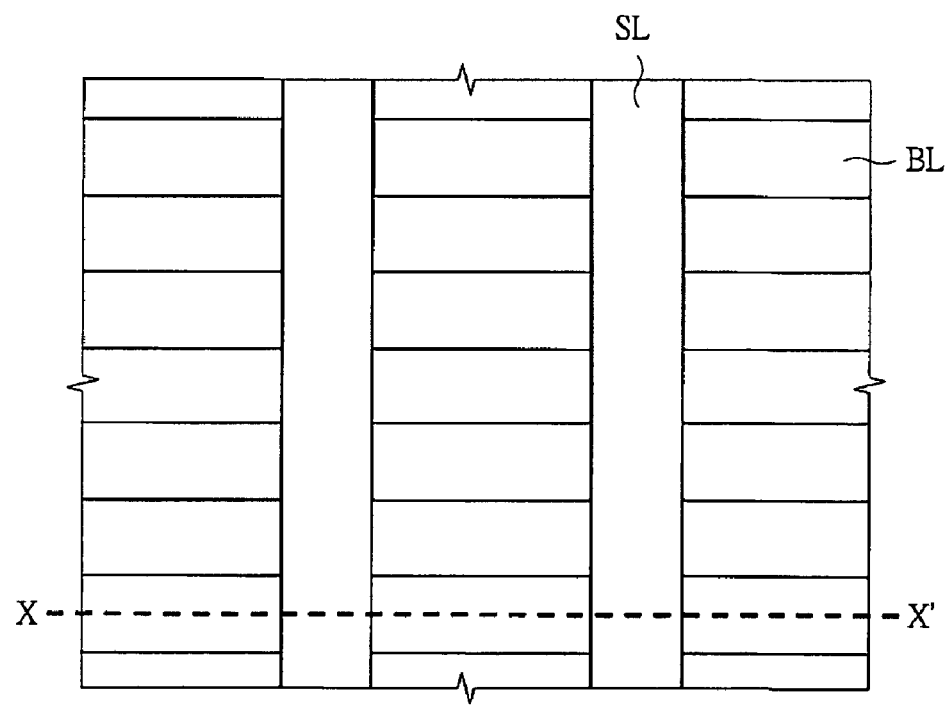
FIG. 10 is a layout diagram of main parts in a portion where respective members configuring a phase-change memory cell are arranged in a manufacturing method of a phase-change memory cell according to the first embodiment of the present invention.
Figure 11:
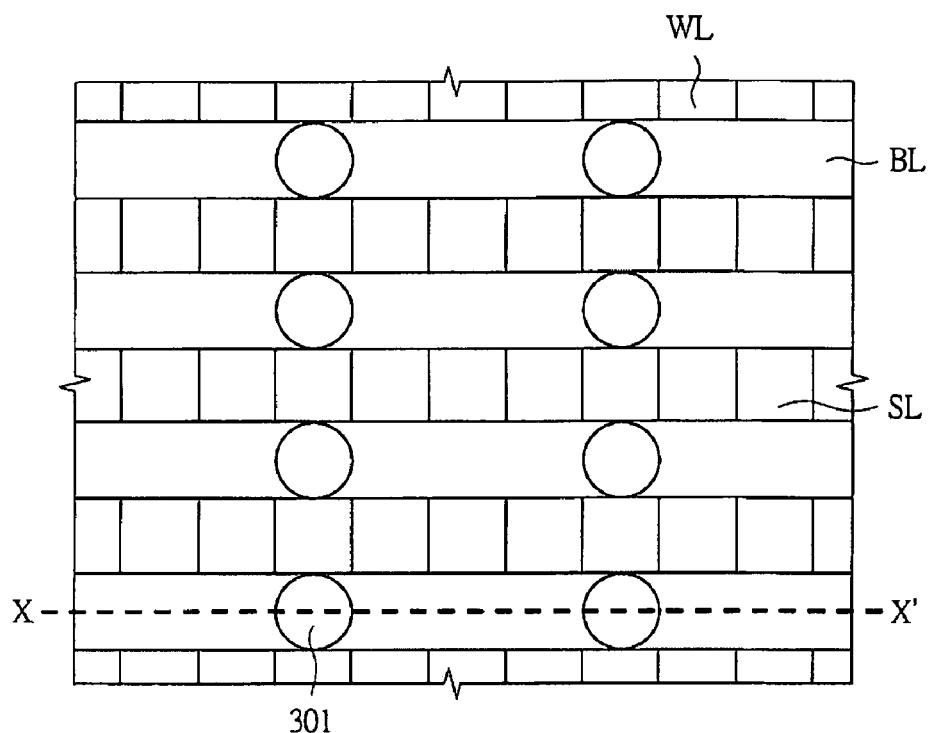
FIG. 11 is a layout diagram of main parts in a portion where respective members configuring a phase-change memory cell are arranged in a manufacturing method of a phase-change memory cell according to the first embodiment of the present invention.
Figure 12:
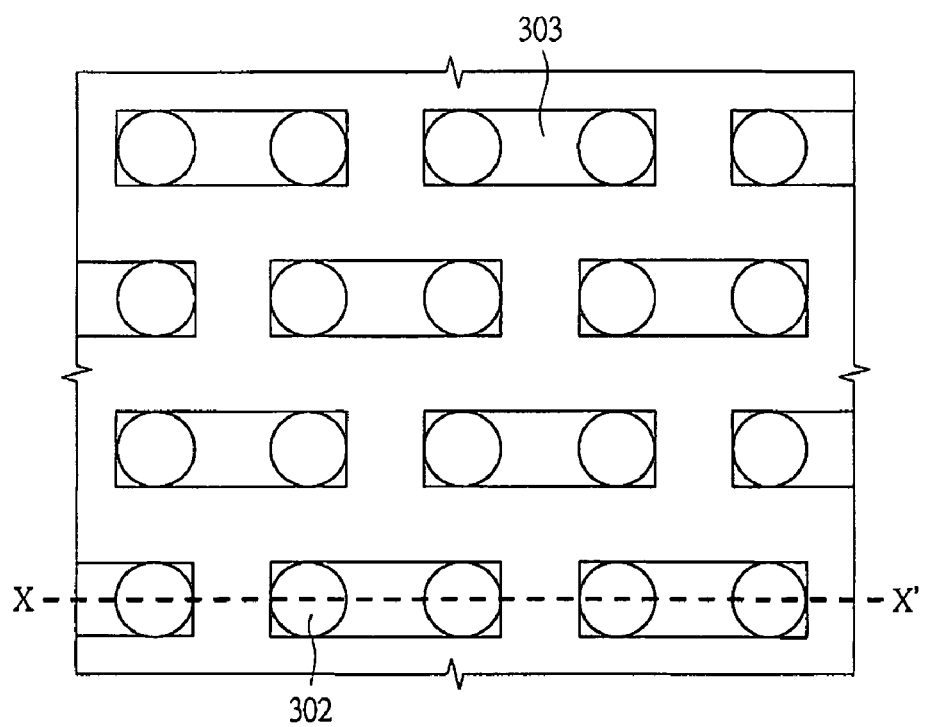
FIG. 12 is a layout diagram of main parts in a portion where respective members configuring a phase-change memory cell are arranged in a manufacturing method of a phase-change memory cell according to the first embodiment of the present invention.

Subsequently, one example of a manufacturing method of a phase-change memory cell will be explained with reference to FIG. 10 to FIG. 20. FIGS. 10 to 12 show layout diagrams of a main portion in a portion where respective members configuring a phase-change memory cell are arranged, FIGS. 13 to 18 show cross-sectional views of a main portion taken along line X-X' in FIGS. 10 to 12, and FIGS. 19 and 20 show cross-sectional views of a main portion of an application example.

FIG. 10 shows a source line SL and a bit line BL. An optimal distance between the source line SL and the bit line BL is selected according to a driving current of a memory cell.

FIG. 11 shows a plug electrode 301, a word line WL, a source line SL, and a bit line BL.

FIG. 12 shows an active region 303 and a contact 302 with the active region.

Figure 13:
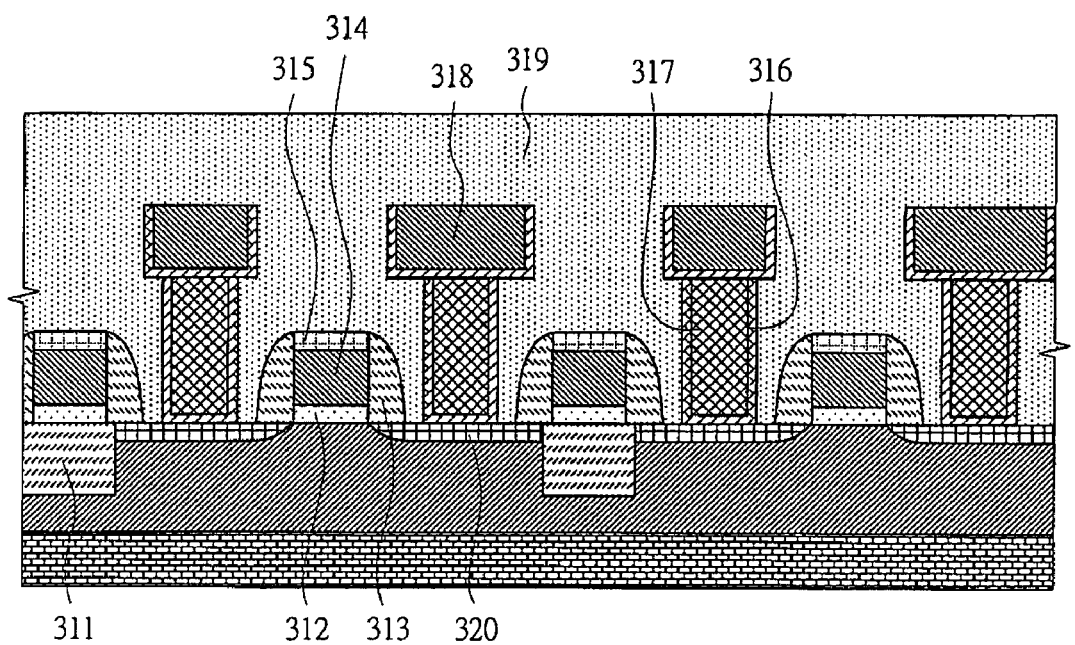
FIG. 13 is a cross-sectional view of a main portion taken along line X-X' in FIGS. 10 to 12 in the manufacturing method of a phase-change memory cell according to the first embodiment of the present invention.

First, a structure shown in FIG. 13 is produced using ordinary semiconductor manufacturing steps. A diffusion layer 320 is separated by a field oxide layer 311. A gate electrode 314 contacts with a gate insulation film 312, sidewalls 313, and a metal silicide 315. In order to improve adhesion between a contact 317 and an interlayer insulation film 319 and prevent peeling-off, an adhesion layer 316 is formed. The contact 317 is connected to a metal wire 318.

Figure 14:
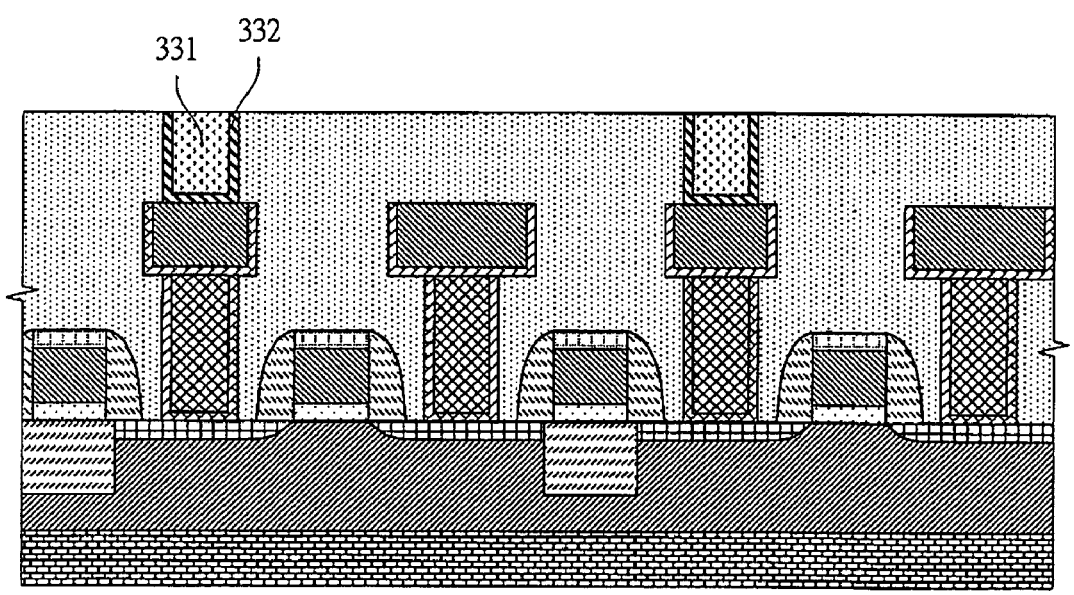
FIG. 14 is a cross-sectional view of a main portion taken along line X-X' in FIGS. 10 to 12 in the manufacturing method of a phase-change memory cell according to the first embodiment of the present invention.

Next, as shown in FIG. 14, a contact hole is formed, and an adhesion layer 332 and a plug electrode 331 are formed in the contact hole by chemical vapor deposition (CVD). As material for the plug electrode 331, material forming a non-ohmic contact between the same and the chalcogenide is selected. By using a material with a high thermal resistance, the diffusion of heat from the plug electrode is prevented, and power required for reprogramming can be reduced. As a composition of the adhesion layer 332, TiN can be used, and W can be used as a composition of material for the plug electrode 331.

Figure 15:
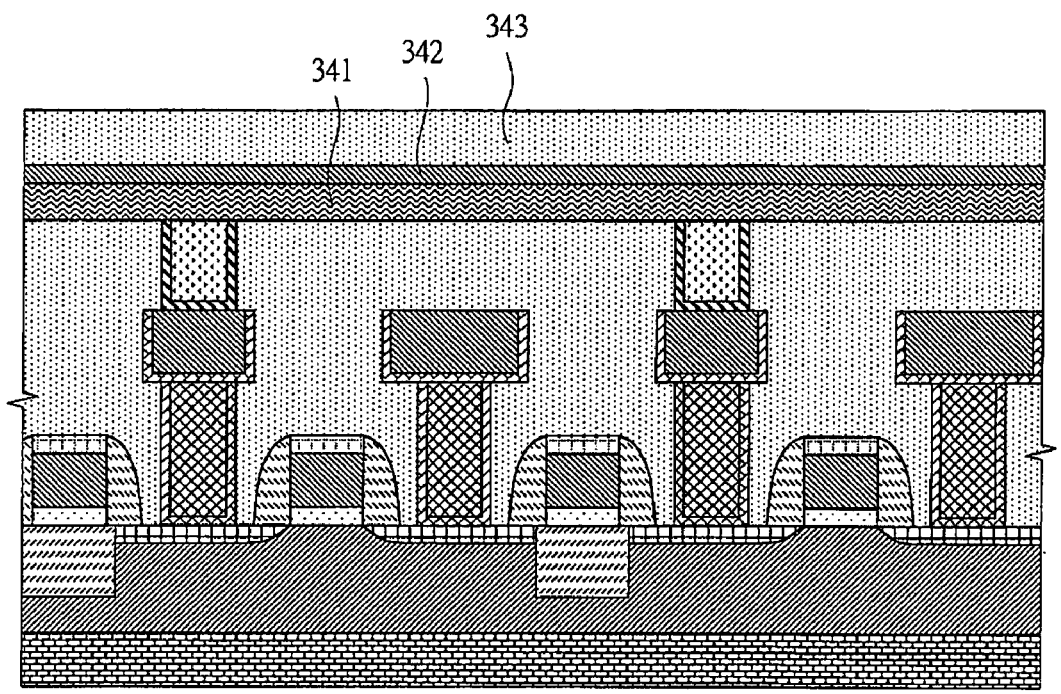
FIG. 15 is a cross-sectional view of a main portion taken along line X-X' in FIGS. 10 to 12 in the manufacturing method of a phase-change memory cell according to the first embodiment of the present invention.

As shown in FIG. 15, films of chalcogenide 341 and a top electrode 342 are formed by sputtering or vacuum deposition, and an interlayer insulation film 343 is formed. As a composition of the chalcogenide 341, alloy of Ge—Sb—Te which has wide credential as a recording type optical disc, or the alloy including additive is suitable.

Figure 16:
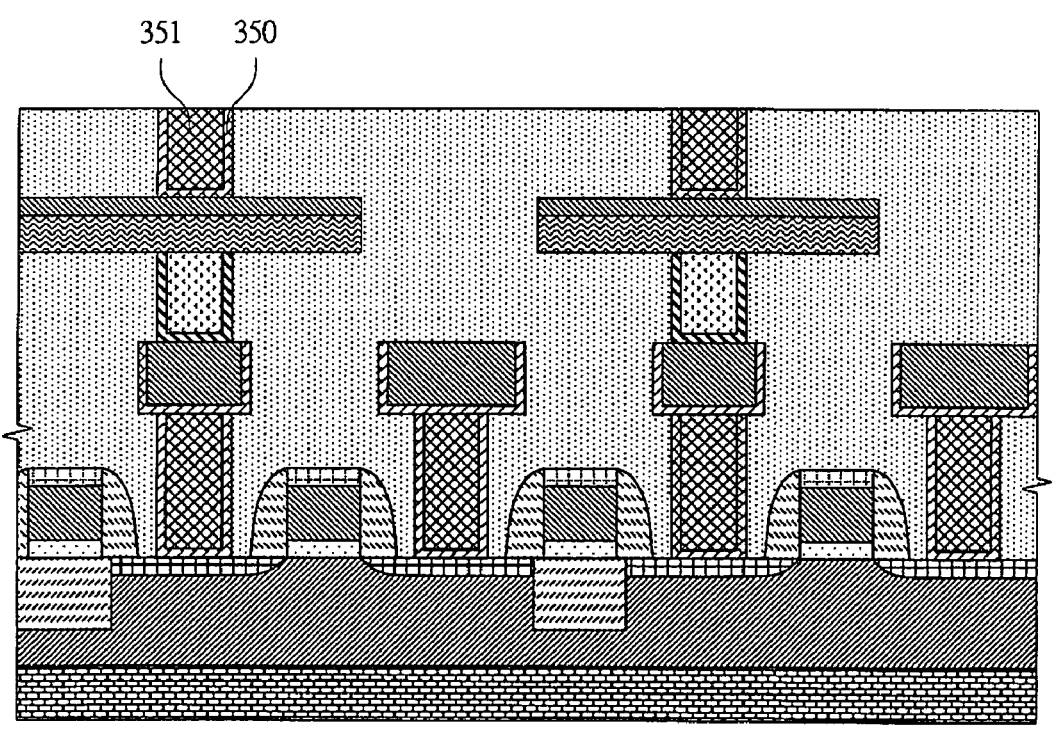
FIG. 16 is a cross-sectional view of a main portion taken along line X-X' in FIGS. 10 to 12 in the manufacturing method of a phase-change memory cell according to the first embodiment of the present invention.

Next, as shown in FIG. 16, a contact hole is formed and an adhesion layer 350 and a contact 351 with a bit line are formed by chemical vapor deposition (CVD).

Figure 17:
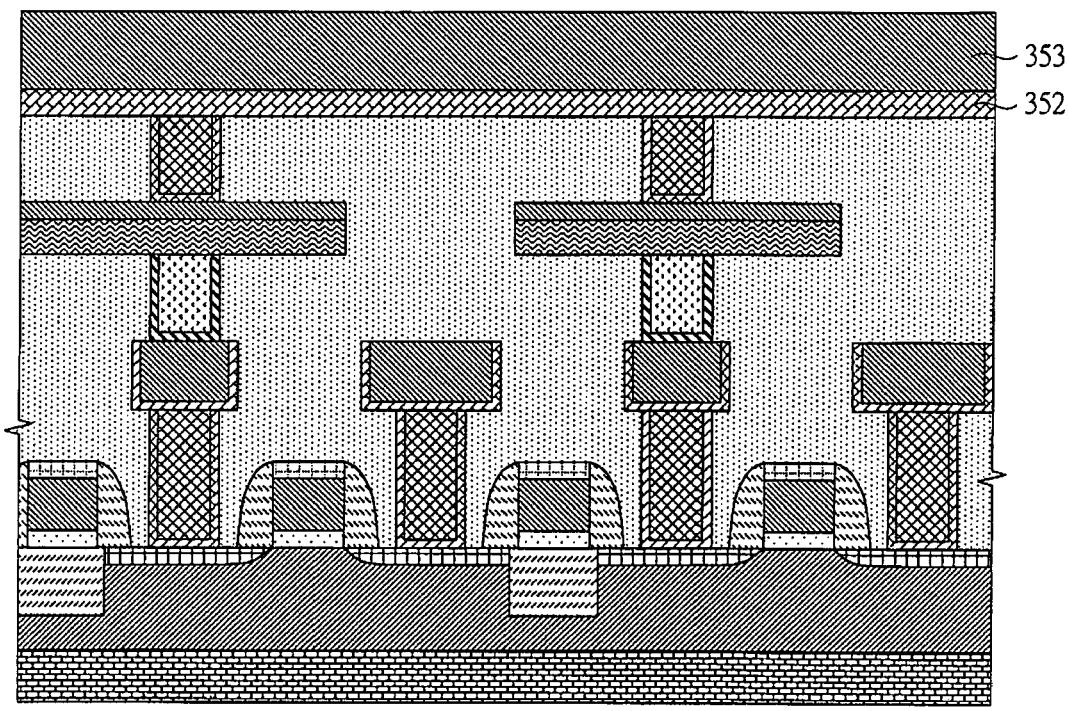
FIG. 17 is a cross-sectional view of a main portion taken along line X-X' in FIGS. 10 to 12 in the manufacturing method of a phase-change memory cell according to the first embodiment of the present invention.

Further, as shown in FIG. 17, an adhesion layer 352 is formed and a bit line 353 is sputtered.

Figure 18:
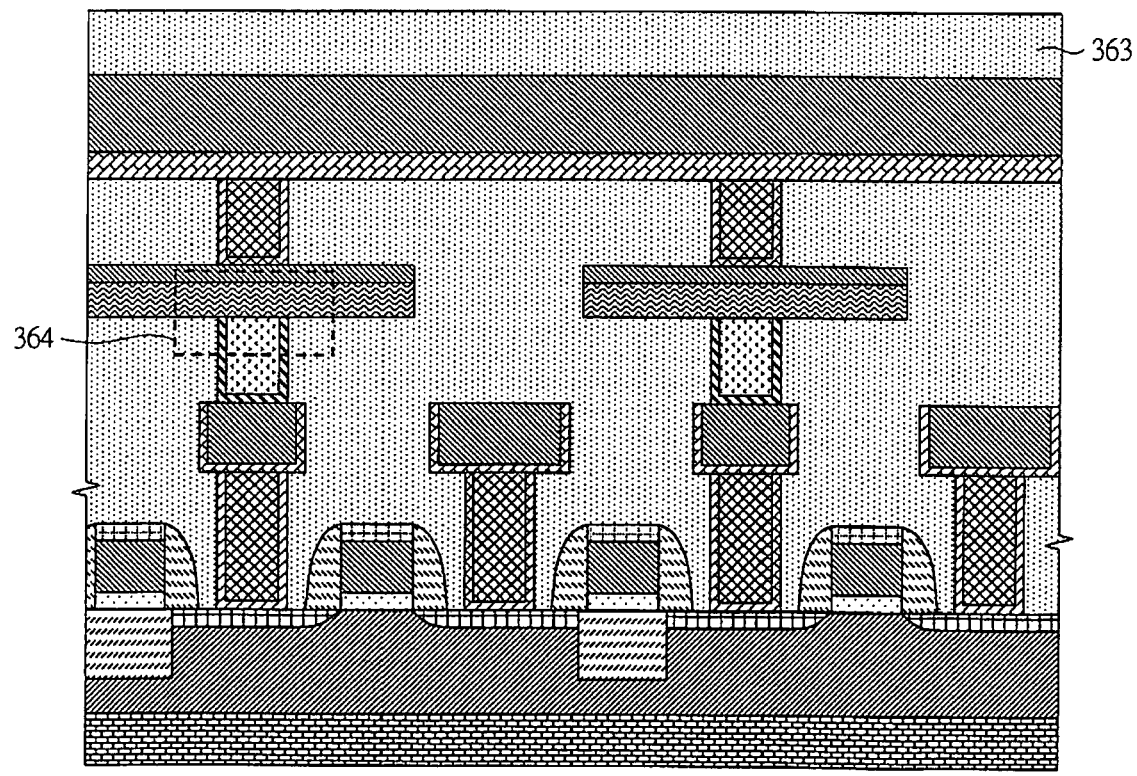
FIG. 18 is a cross-sectional view of a main portion taken along line X-X' in FIGS. 10 to 12 in the manufacturing method of a phase-change memory cell according to the first embodiment of the present invention.

Subsequently, as shown in FIG. 18, it is possible to manufacture a desired phase-change memory cell by forming an interlayer insulation film 363 and further forming a top electrode. Note that, in FIG. 18, reference numeral 364 denotes a portion corresponding to the information memory section shown in FIG. 4.

In the present embodiment, it is possible to conduct manufacturing pursuant to an ordinary CMOS logic embedded design rule, and the embodiment can be applied to the manufacture of a logic embedded memory.

Figure 19:
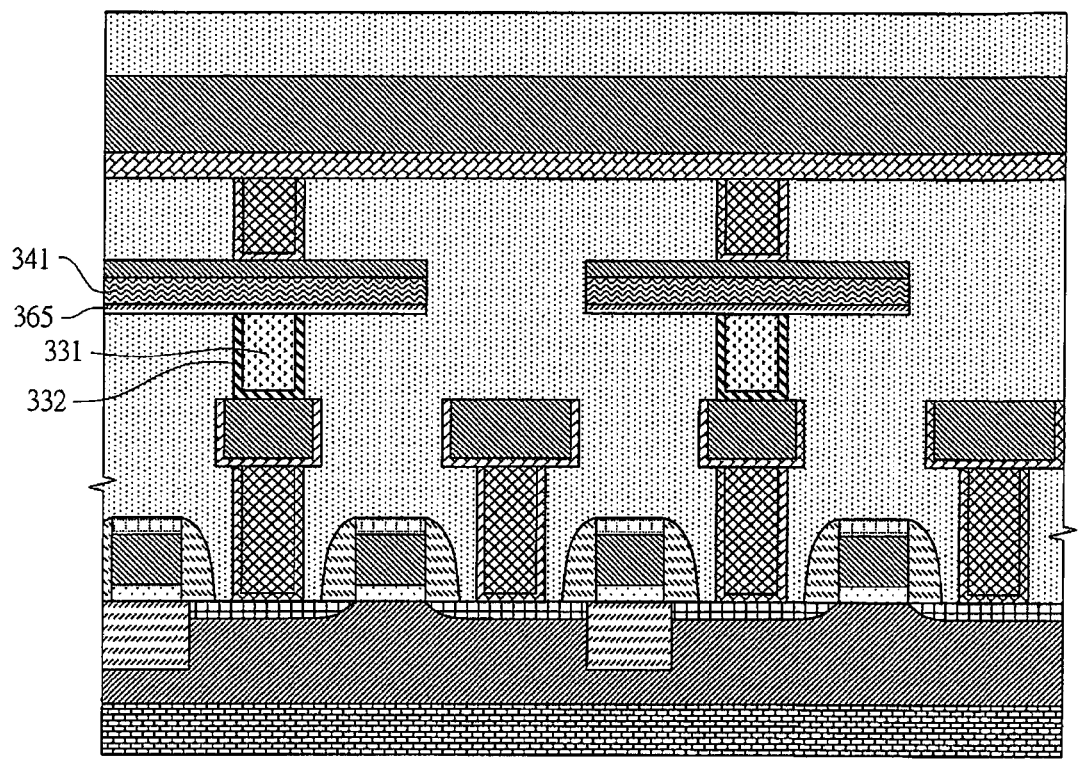
FIG. 19 is a cross-sectional view of a main portion of an application example in the manufacturing method of a phase-change memory cell according to the first embodiment of the present invention.

As shown in FIG. 19, a structure has a heater layer 365 sandwiched between the plug electrode 331, the adhesion layer 332, and the chalcogenide 341. The heater layer 365 has an electrical resistance higher than that of the plug electrode 331, and current is efficiently converted to heat in the heater layer 365 at the time of a reprogramming operation. Further, a non-ohmic interface resistance is present between the heater layer 365 and the chalcogenide 341, so that high-speed reading is made possible. It is preferable that the non-ohmic interface resistance is formed by a Schottky junction or a p-n junction. When the p-n junction is formed, the heater layer 365 is made from a semiconductor material.

Figure 20:
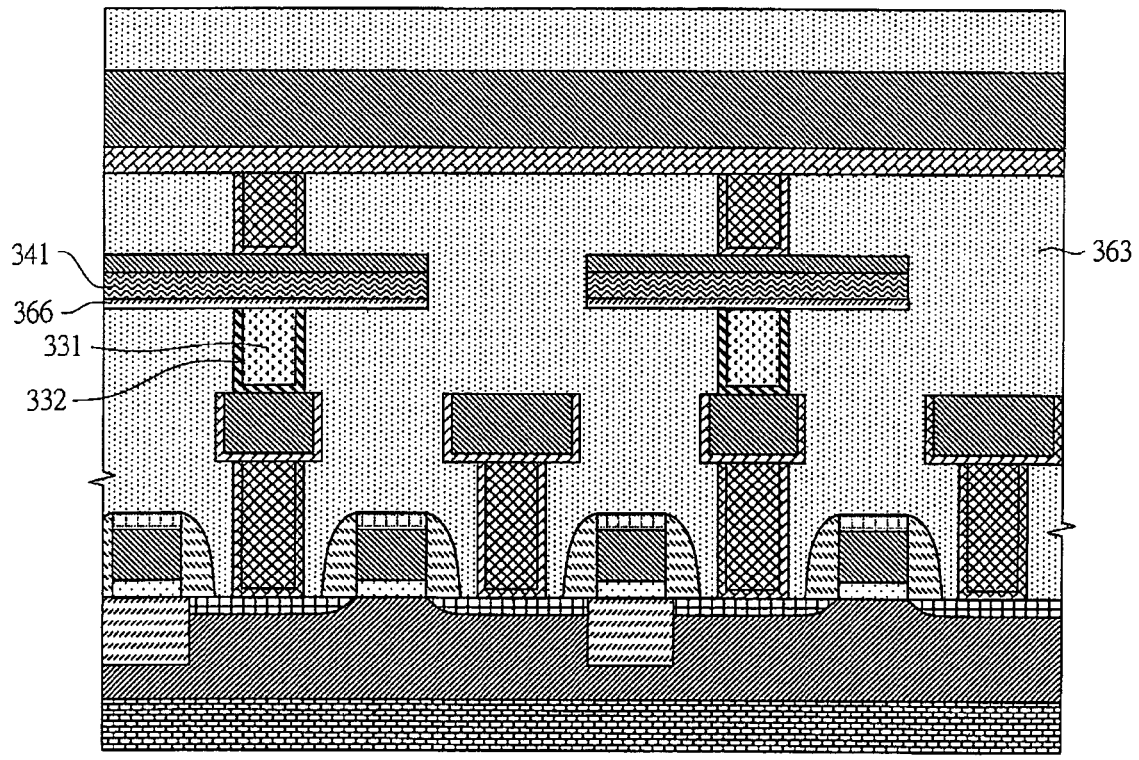
FIG. 20 is a cross-sectional view of a main portion of the application example in the manufacturing method of a phase-change memory cell according to the first embodiment of the present invention.

As shown in FIG. 20, a structure has a bonding layer 366 sandwiched between the plug electrode 331, the adhesion layer 332, and the chalcognide 341. The bonding layer 366 has excellent bonding force to the interlayer insulation film 363, the plug electrode 331, and the chalcogenide 341, and it can prevent peeling-off of the chalcogenide and the occurrence of a depletion portion in the chalcogenide during a manufacture step, and the occurrence of a depletion portion in the chalcogenide during memory cell operation. As a result, yield and programming reliability during manufacturing are improved. The non-ohmic interface resistance is present between the bonding layer 366 and the chalcogenide 341, so that high-speed reading operation is made possible. It is preferable that the bonding layer 366 is made from a dielectric material.

Second Embodiment

Figure 21:
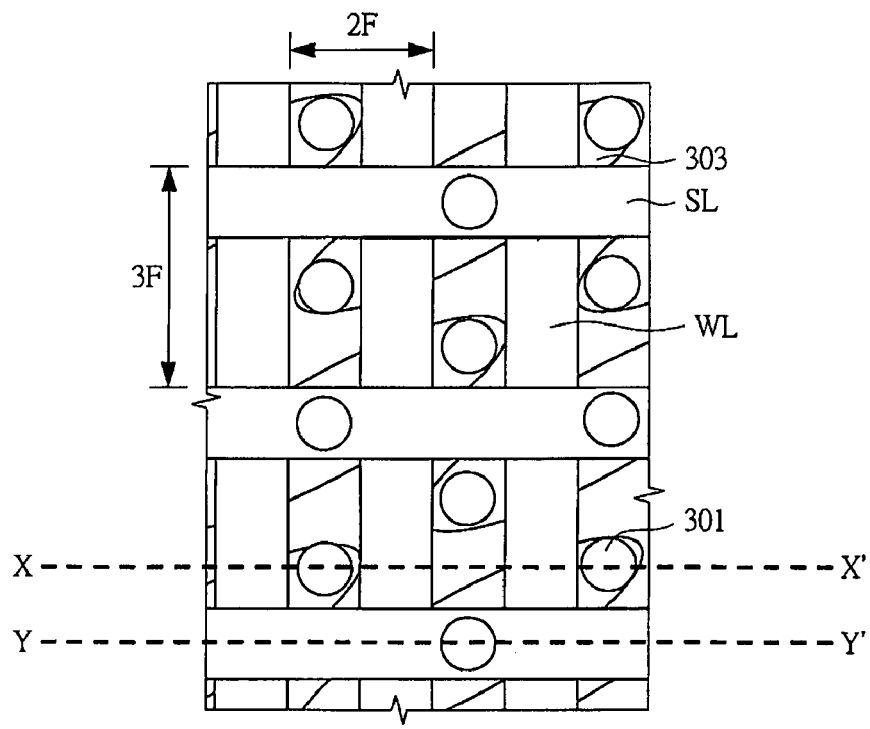
FIG. 21 is a layout diagram of main parts in a portion where respective members configuring a phase-change memory cell are arranged in a manufacturing method of a phase-change memory cell according to a second embodiment of the present invention.
Figure 22:
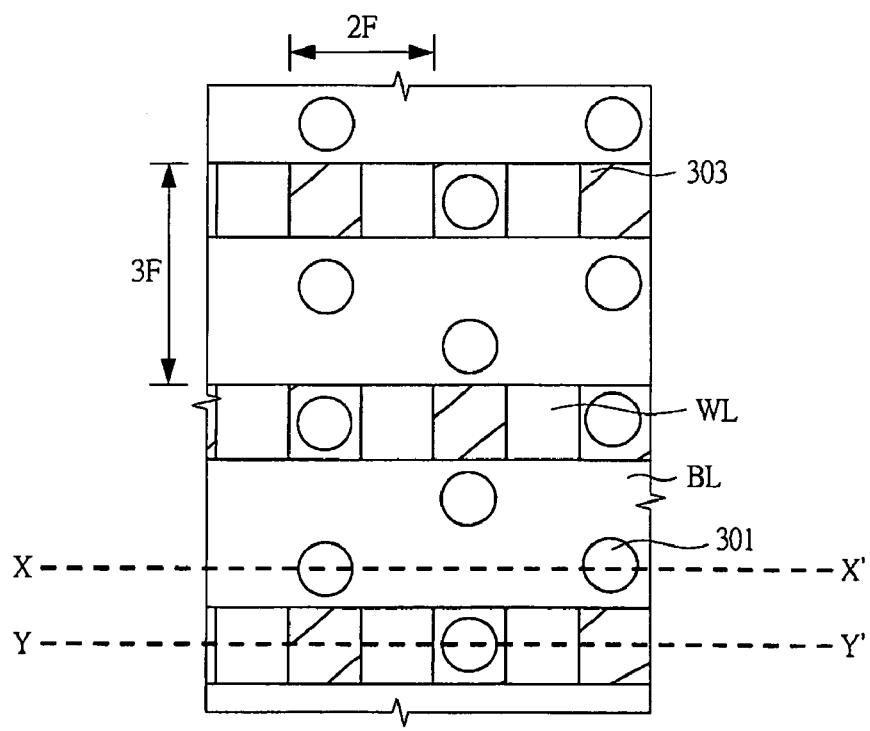
FIG. 22 is a layout diagram of main parts in a portion where respective members configuring a phase-change memory cell are arranged in a manufacturing method of a phase-change memory cell according to the second embodiment of the present invention.
Figure 23:
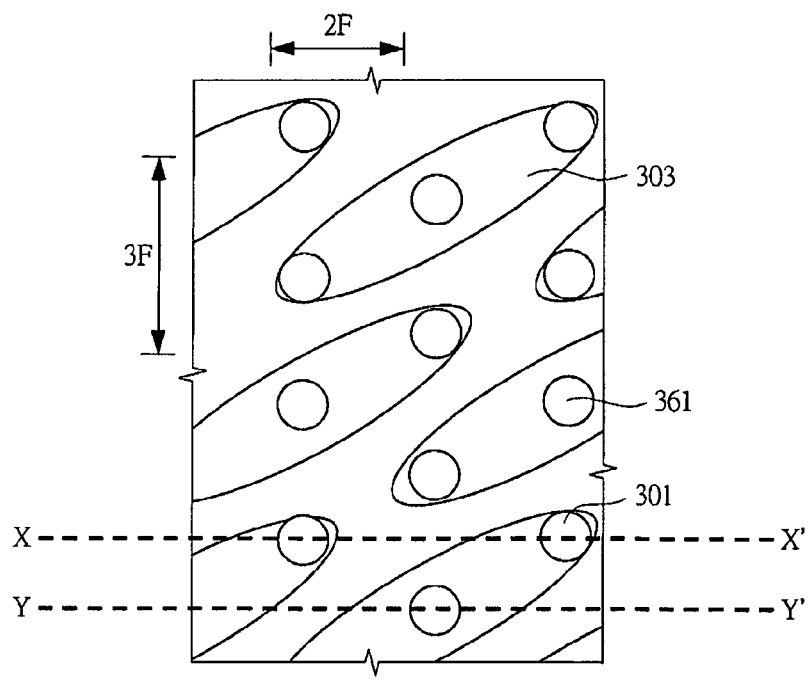
FIG. 23 is a layout diagram of main parts in a portion where respective members configuring a phase-change memory cell are arranged in a manufacturing method of a phase-change memory cell according to the second embodiment of the present invention.

One example of a phase-change memory cell according to second embodiment of the present invention will be explained in detail with reference to FIGS. 21 to 26. FIGS. 21 to 23 show layout diagrams of a main portion where respective members configuring a phase-change memory cell are arranged, FIG. 24 shows a cross-sectional view of a main portion taken along line X-X' in FIGS. 21 to 22, FIG. 25 shows a cross-sectional view of a main portion taken line Y-Y' in FIGS. 21 to 22, and FIG. 26 shows a layout diagram of main parts of an application example.

The second embodiment is an example of an application to a structure of a phase-change memory cell with a high integration degree, as will be explained below.

FIG. 21 shows an active region 303, a source line SL, the word line WL, and a plug electrode 301 contacting a chalcogenide. When a minimum working size is represented by F, a word line spacing is 2F, and a source line spacing is 3F. FIG. 22 shows the active region 303, the word line WL, a bit line BL, and the plug electrode 301 contacting the chalcogenide. Further, FIG. 23 shows the contact 361 with the source line.

Figure 24:
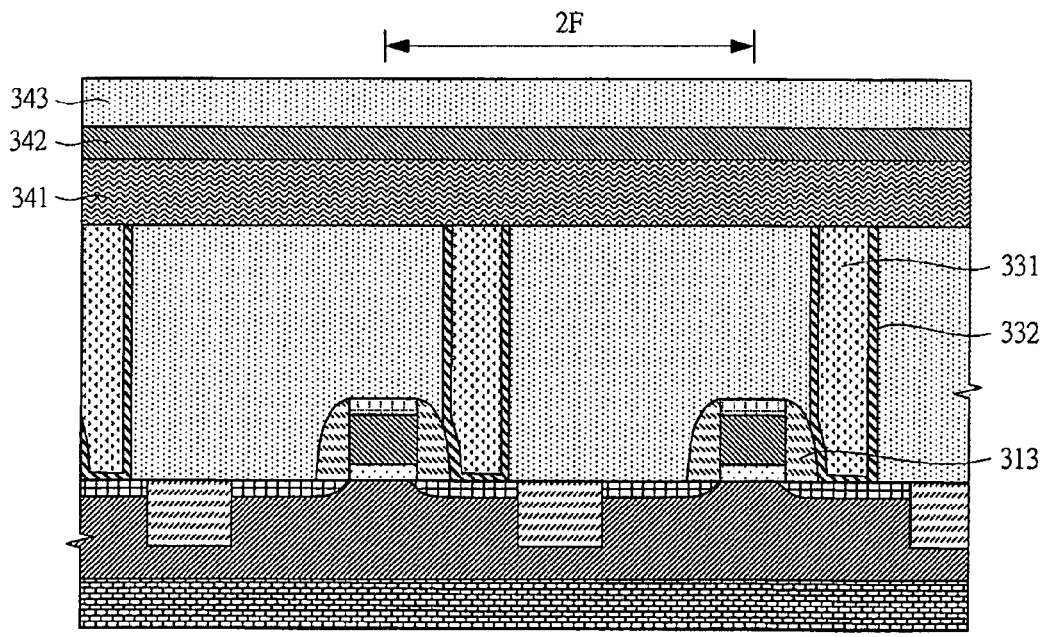
FIG. 24 is a cross-sectional view of a main portion taken along line X-X' in FIGS. 21 to 22 in the manufacturing method of a phase-change memory cell according to a second embodiment of the present invention.
Figure 25:
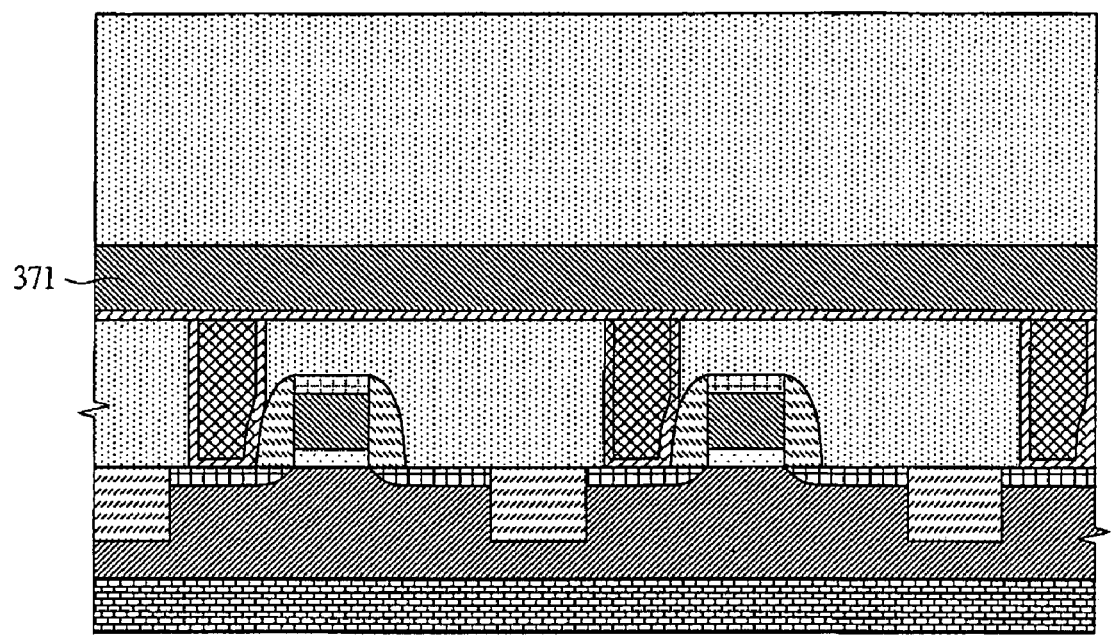
FIG. 25 is a cross-sectional view of a main portion taken along line Y-Y' in FIGS. 21 to 12 in the manufacturing method of the phase-change memory cell according to the second embodiment of the present invention.
Figure 26:
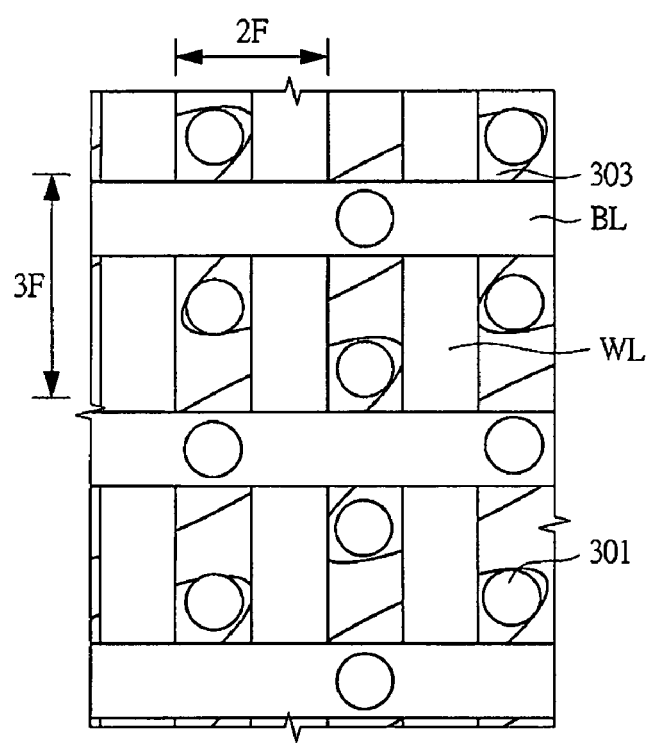
FIG. 26 is a layout diagram of main parts of an application example of the manufacturing method of a phase-change memory cell according to the second embodiment of the present invention.

In FIGS. 24 and 25, a plug electrode 331 is formed using a sidewall 313 in a self-aligning manner. It is preferable that material for the sidewall 313 is a material having a large selection ratio to an interlayer insulation film 343 at processing. A bit line denoted by reference numeral 342 is used as a top electrode of a chalcogenide 341.

The second embodiment is low in regards to consistency with a CMOS logic design rule, but it is possible to set a memory cell area to $6F^2$, so that the second embodiment is suitable for a stand-alone memory with a large capacity.

As shown in FIG. 26, such a configuration can be adopted that a bit line BL is disposed and a top electrode of the chalcogenide is utilized as a source line. In this case, since separation of the source line is not performed, fine working to the source line is not required, so that it is possible to reduce damage to the chalcogenide due to the working. Thereby, it becomes possible to manufacture a phase-change memory cell with high reliability.

Third Embodiment

Figure 27:
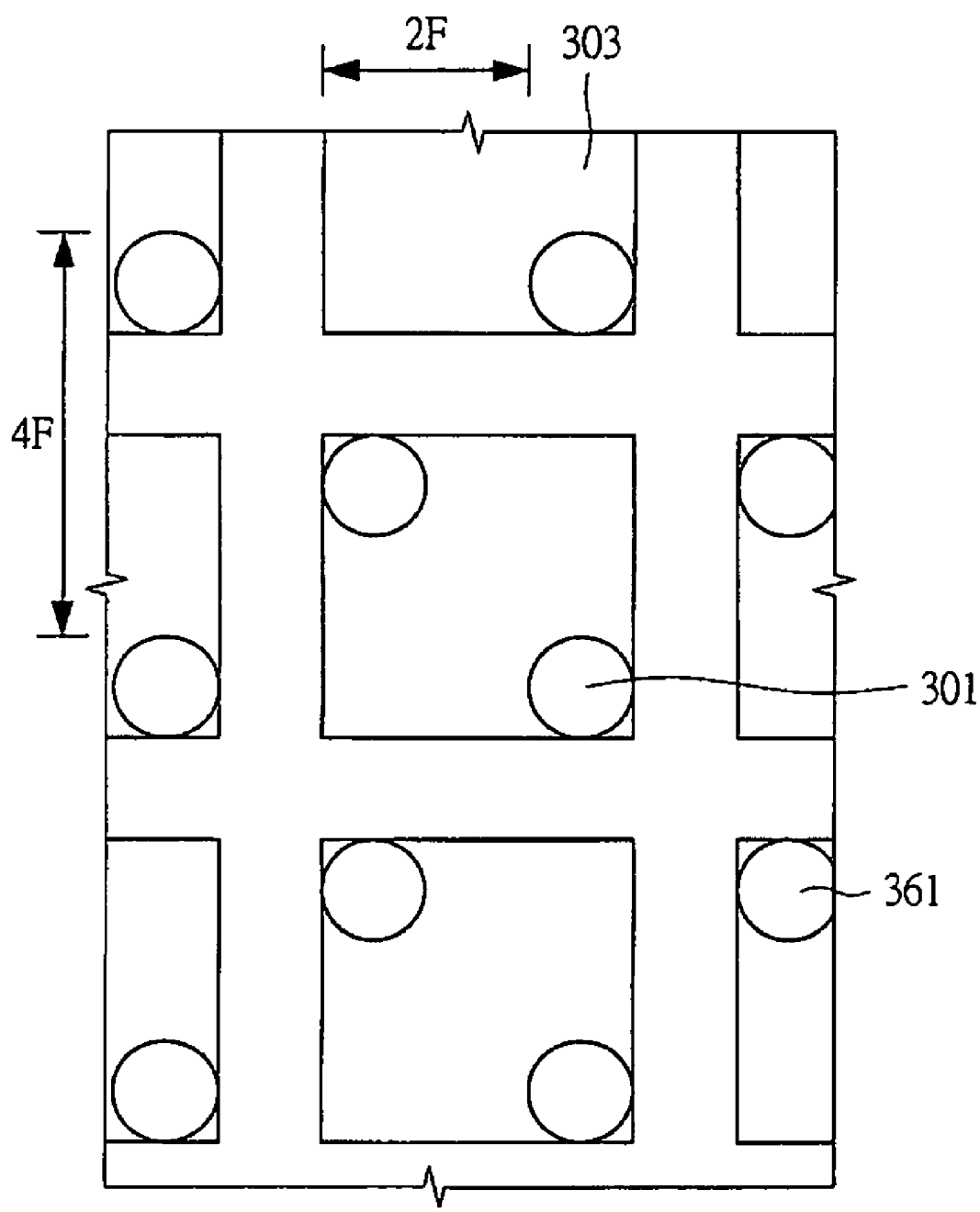
FIG. 27 is a layout diagram of main parts in a portion where respective members configuring a phase-change memory cell are arranged in a manufacturing method of a phase-change memory cell according to a third embodiment of the present invention.
Figure 28:
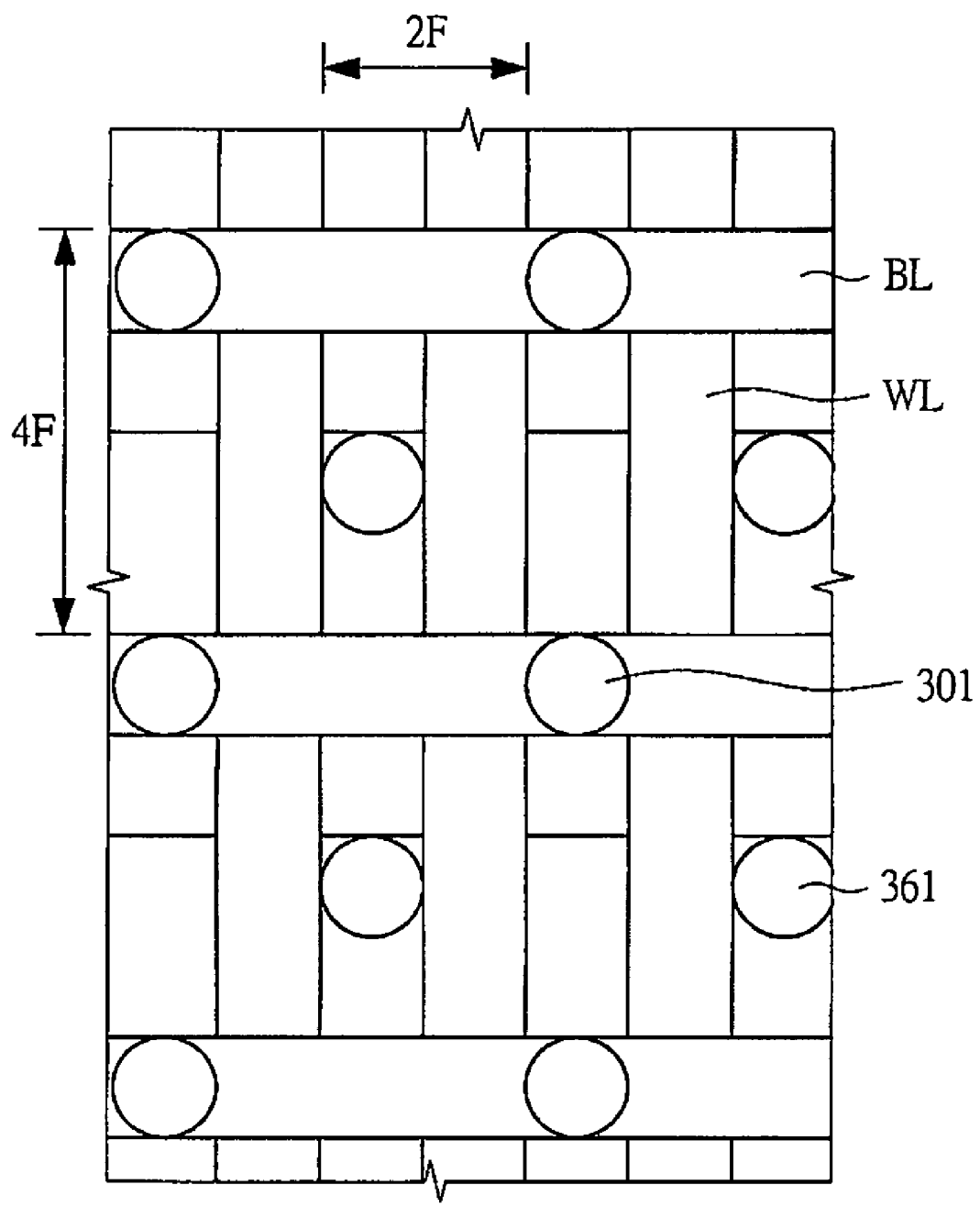
FIG. 28 is a layout diagram of main parts in a portion where respective members configuring a phase-change memory cell are arranged in the manufacturing method of a phase-change memory cell according to the third embodiment of the present invention.

One example of a phase-change memory cell according to a third embodiment of the present invention will be explained in detail with reference to FIGS. 27 and 28. FIGS. 27 and 28 show layout diagrams of a main portion where respective members configuring a phase-change memory cell are arranged.

The third embodiment is an example where the present invention has been applied to a structure in which both high integration and reliability of a phase-change memory cell are achieved, and it will be explained below.

FIG. 27 shows an active region 303, a plug electrode 301, and a contact 361 with a source line. Further, a bit line BL and a word line WL are shown in FIG. 28. A word line spacing is 2F and a bit line spacing is 4F. An area of a memory cell is $8F^2$. Since the structure can take large bit line spacing, such a merit can be obtained that it is easy to conduct the separation of the chalcogenide. Thereby, both high integration and high reliability can be achieved.

Fourth Embodiment

Figure 29:
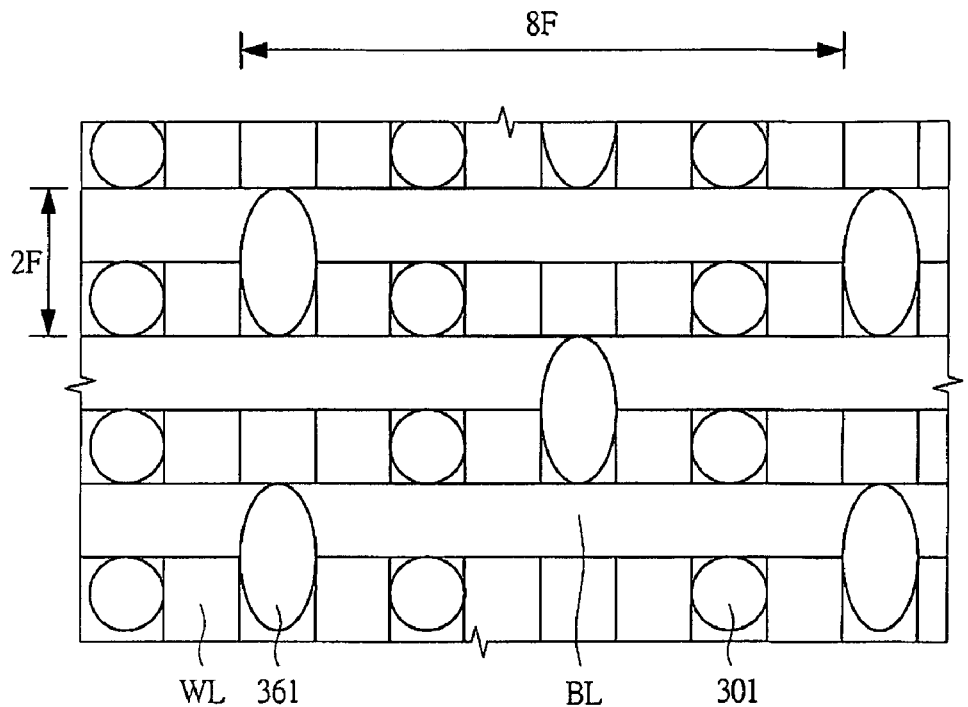
FIG. 29 is a layout diagram of main parts in a portion where respective members configuring a phase-change memory cell are arranged in a manufacturing method of a phase-change memory cell according to a fourth embodiment of the present invention.
Figure 30:
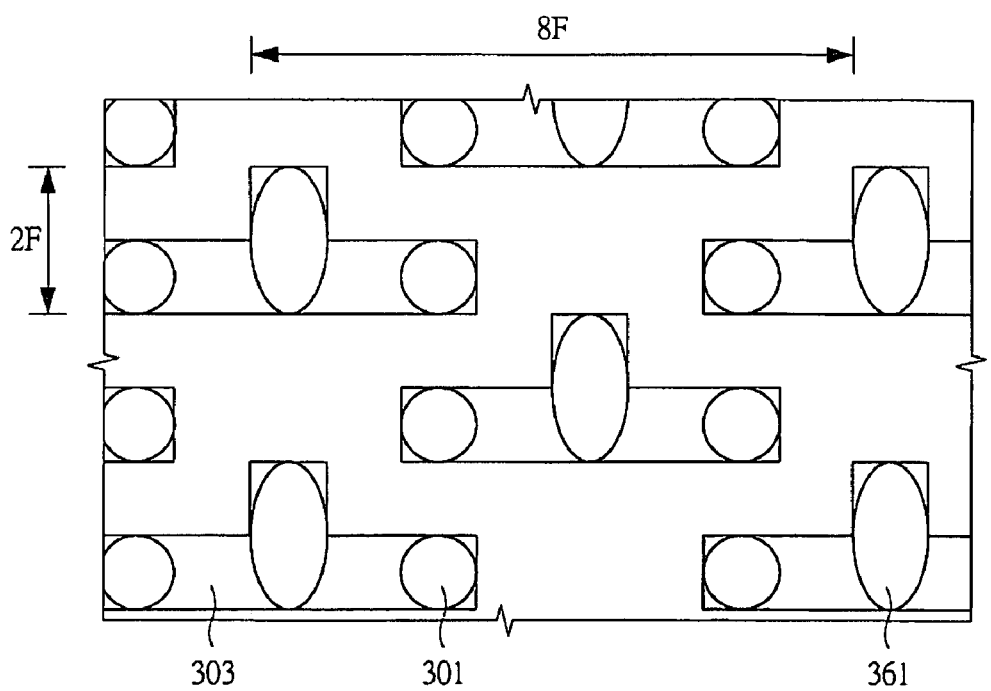
FIG. 30 is a layout diagram of main parts in a portion where respective members configuring a phase-change memory cell are arranged in the manufacturing method of a phase-change memory cell according to the fourth embodiment of the present invention.

One example of a phase-change memory cell according to a fourth embodiment of the present invention will be explained in detail with reference to FIGS. 29 and 30. FIGS. 29 and 30 show layout diagrams of a main portion in a portion where respective members configuring a phase-change memory cell are arranged.

The fourth embodiment is an example where the present invention has been applied to a structure of a phase-change memory cell which can operate at higher speed, as will be explained below.

FIG. 29 shows a bit line BL, a word line WL, a plug electrode 301, and a contact 361 with a source line. Further, FIG. 30 shows an active region 303. A merit of this structure lies in that high-speed operation can be performed since a word line length can be reduced.

Fifth Embodiment

Figure 31:
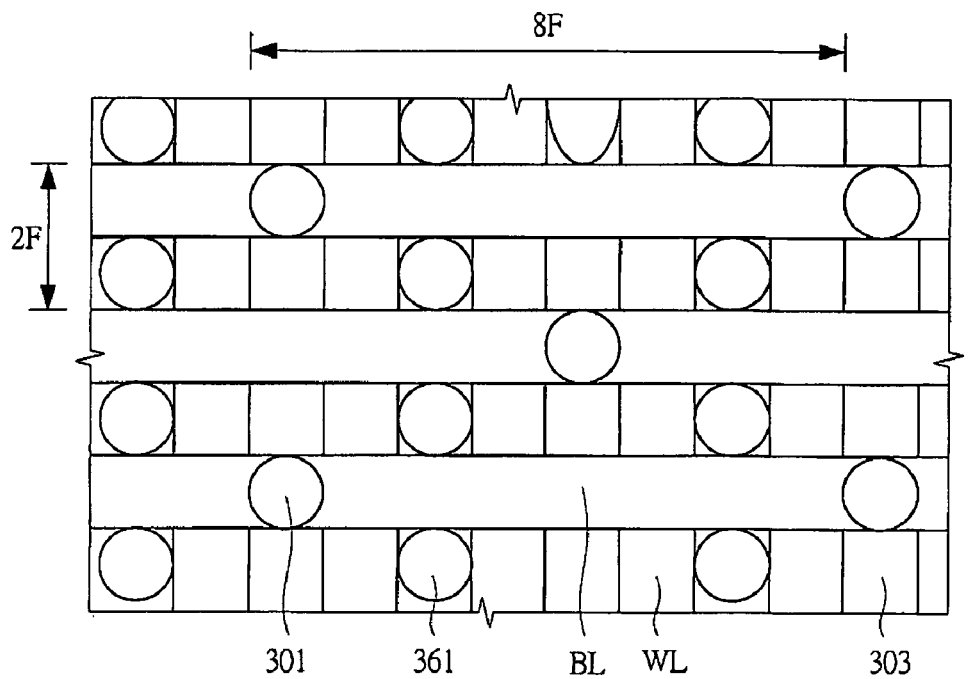
FIG. 31 is a layout diagram of main parts in a portion where respective members configuring a phase-change memory cell are arranged in a manufacturing method of a phase-change memory cell according to a fifth embodiment of the present invention.
Figure 32:
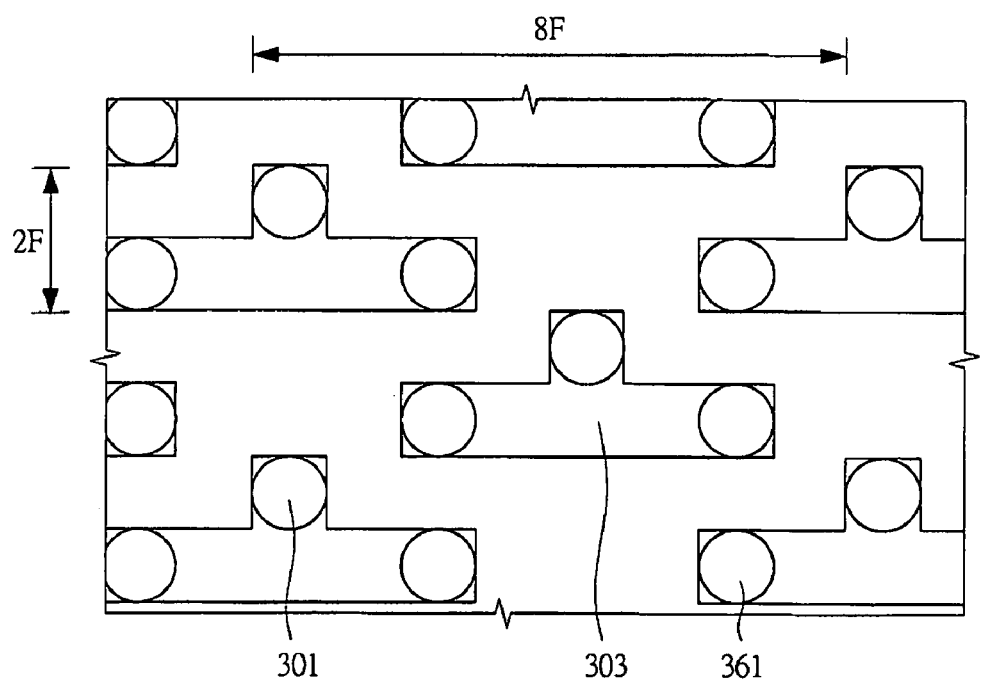
FIG. 32 is a layout diagram of main parts in a portion where respective members configuring a phase-change memory cell are arranged in the manufacturing method of a phase-change memory cell according to the fifth embodiment of the present invention.

One example of a phase-change memory cell according to a fifth embodiment of the present invention will be explained in detail with reference to FIGS. 31 and 32. FIGS. 31 and 32 show layout diagrams of a main portion in a portion where respective members configuring a phase-change memory cell are arranged.

The fifth embodiment is an example where the present invention has been applied to a structure of a phase-change memory cell which can operate with an optimal current amount, as will be explained below.

FIG. 31 shows a bit line BL, a plug electrode 301, a word line WL, a contact 361 with a source line, and an active region 303. FIG. 32 shows a region defining the active region 303 clearly. A merit of the structure lies in that, since two transistors are used in one memory cell, one transistor is used for the set operation and two transistors are used for the reset operation so that the respective operations can be performed with corresponding optimal current amounts.

Sixth Embodiment

One example of a memory module including a phase-change memory cell according to a sixth embodiment of the present invention will be explained with reference to FIGS. 33 and 34.

Figure 33:
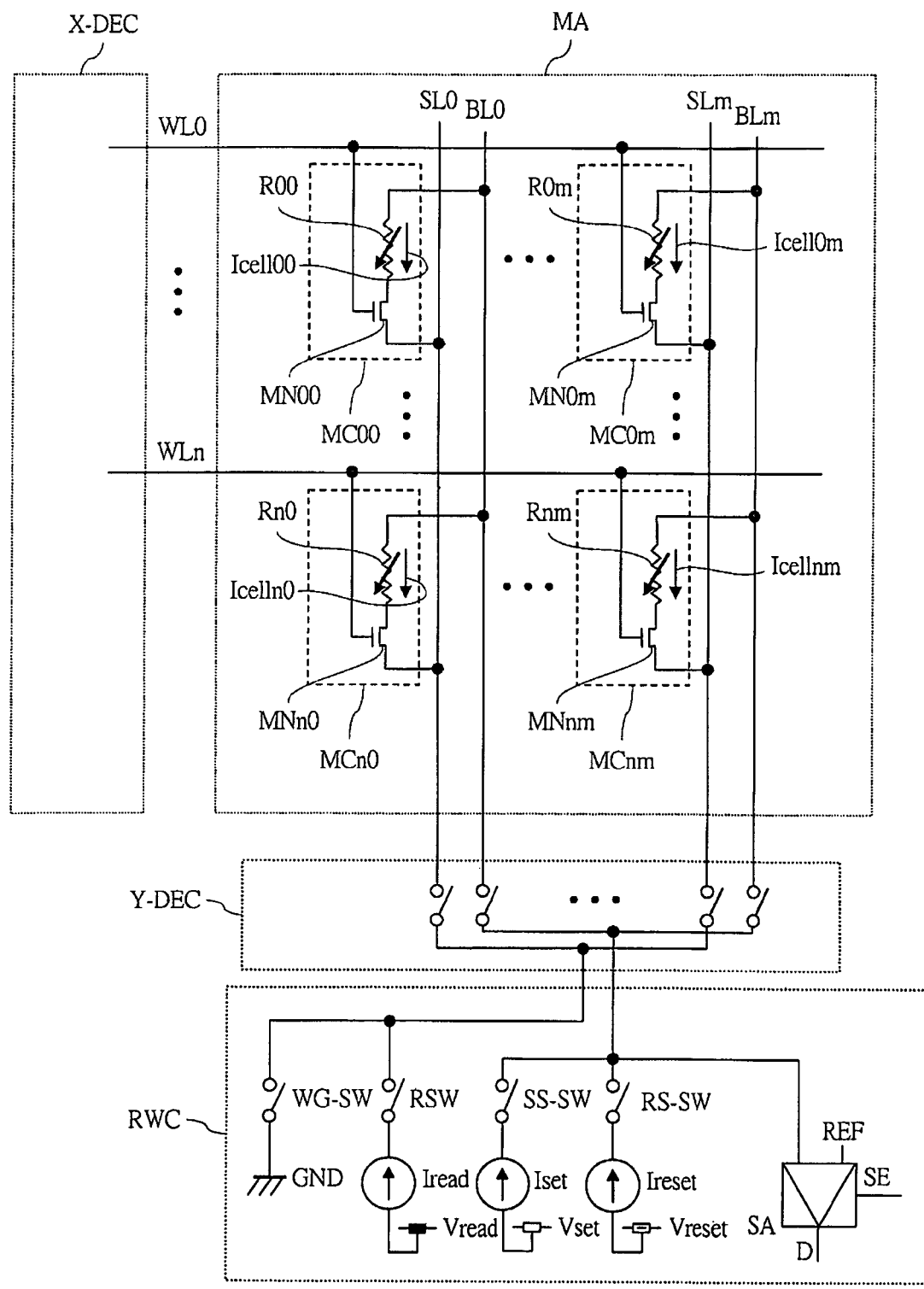
FIG. 33 is a circuit diagram configuring a main portion of a memory module including a phase change memory cell according to a sixth embodiment of the present invention.
Figure 34:
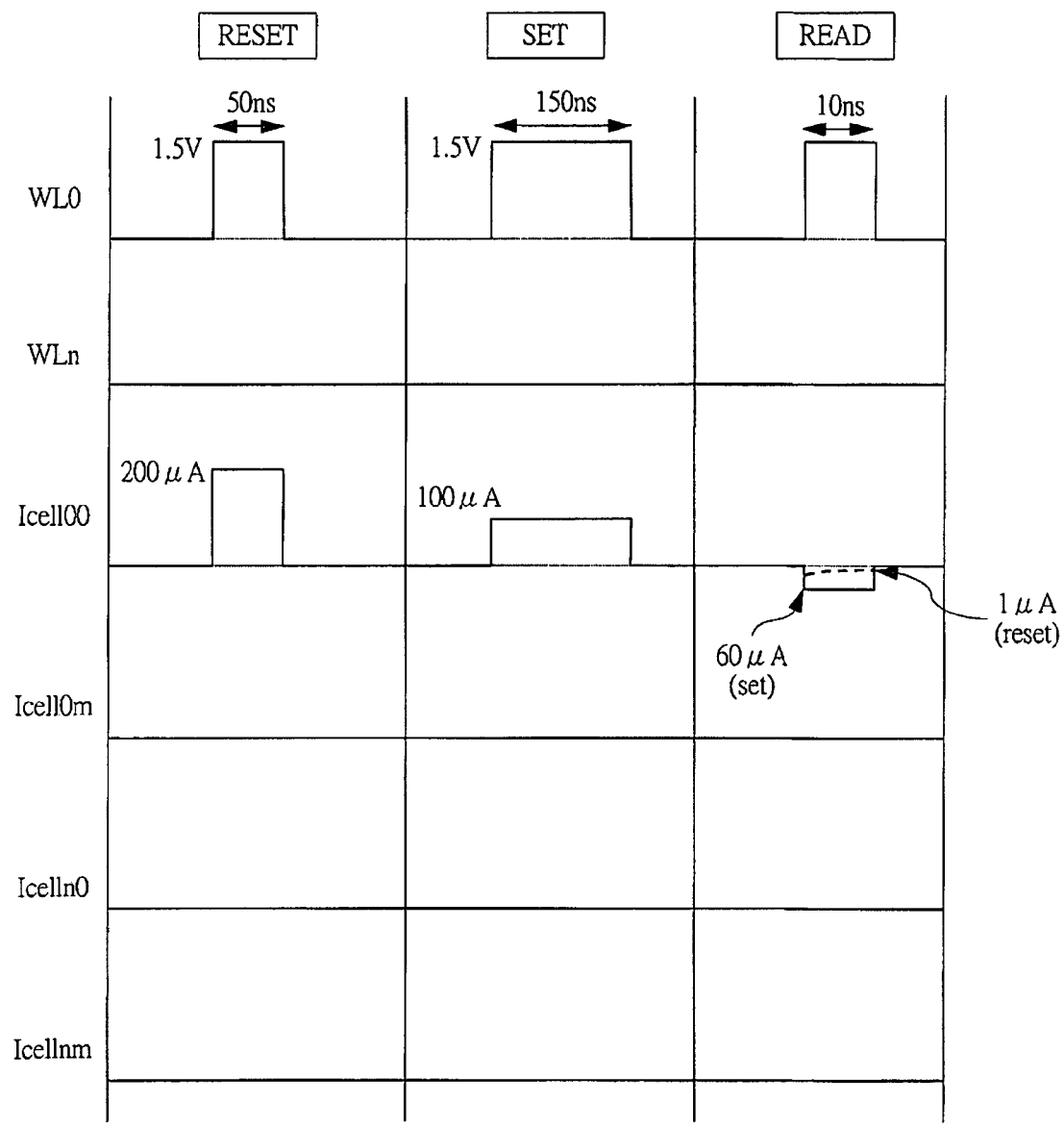
FIG. 34 is a diagram showing programming and reading operations in a memory module including the phase-change memory cell according to the sixth embodiment of the present invention.
Figure 35:
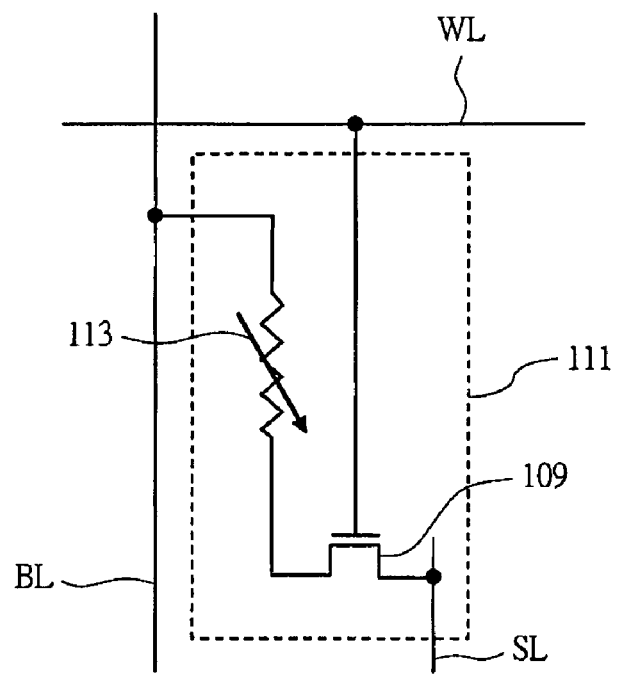
FIG. 35 is a diagram showing a circuit configuration of a phase-change memory cell which has been examined by the inventors.
Figure 36:
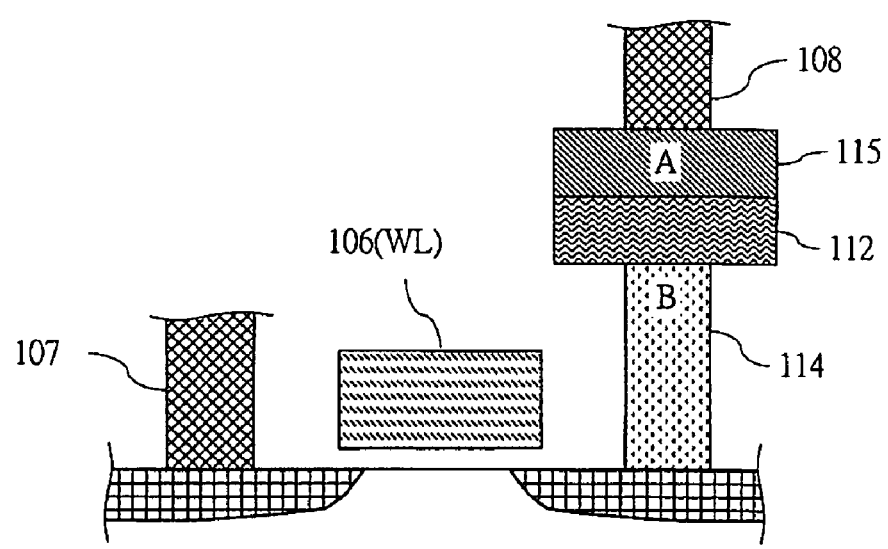
FIG. 36 is a diagram showing a structure of the phase-change memory cell which has been examined by the inventors.
Figure 37:
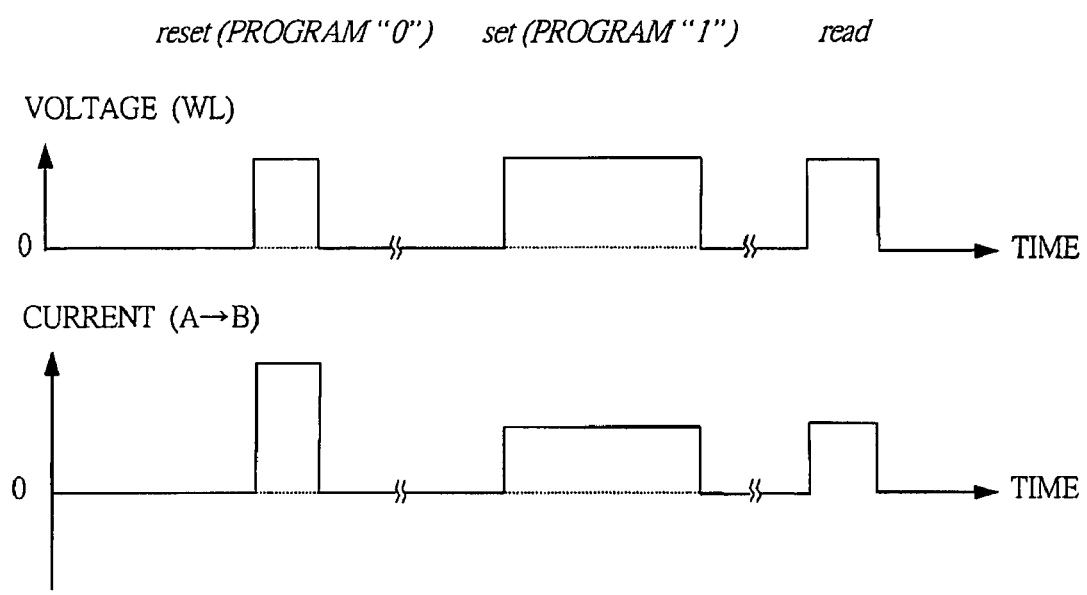
FIG. 37 is a diagram showing an operating method of the phase-change memory cell which has been examined by the inventors.

FIG. 33 shows a circuit diagram configuring a main portion of a memory module including a phase-change memory. In the sixth embodiment, the memory module comprises a memory array section MA, an X-system address decoder X-DEC, a Y-system address decoder Y-DEC, a reading/programming circuit RWC, and the like.

The memory array section MA comprises a plurality of bit lines BL (BL0 to BLm), a plurality of source lines SL (SL0 to SLm), and a plurality of word lines WL (WL0 to WLn), and memory cells MC (MC00 to MCnm) are connected to intersecting points of respective bit lines BL with the respective word lines WL. The respective memory cells MC comprise select elements MN (MN00 to MNnm) and memory elements R (R00 to Rnm). The memory element R is a phase-change element and it has a low resistance in a range of 1 k$\Omega$ to 10 k$\Omega$ in a crystalline state, while it has a high resistance in a range of 100 k$\Omega$ to 100 M$\Omega$ in an amorphous state. The select element MN is an N-channel type MOSFET. For example, the gate electrode of the select element MN00 is connected to the word line WL0, the drain electrode thereof is connected to the memory element R00, and the source electrode thereof is connected to the source line SL0. Connections of the remaining select elements are similarly conducted.

Note that, in the present embodiment, the MOSFET is used as the select element, but a bipolar transistor may be used instead of the MOSFET. In this case, since the driving ability of the select element per unit area is high, such a merit can be obtained that the memory cell area can be reduced.

The X-system address decoder X-DEC is connected with the word lines WL, and one word line WL is selected by an X-system address signal. The Y-system address decoder Y-DEC is connected to one ends of the bit lines BL and the source lines SL, and a set of bit line BL and source line SL is selected by a Y-system address signal to be connected to the reading/programming circuit RWC described later.

Note that, in the present embodiment, one reading/programming circuit RWC is provided for each of the memory array sections MA, but a plurality of reading/programming circuits may be provided for each memory array section, in the alternative. In this case, since reading/programming operation can be simultaneously performed to a plurality of bits, such an effect can be obtained that high-speed operation can be made possible.

The reading/programming circuit RWC comprises a sense amplifier SA, a reading current source Iread, a reset switch RS-SW for the reading current source Iread, a reset current source Ireset, a reset switch RS-SW for the reset current source Ireset, a set current source Iset, a set switch SS-SW for the set current source Iset, a programming ground switch WG-SW, and the like. The current sources Iread, Iset, and Ireset are connected to a read operation voltage source Vread, a set operation voltage source Vset, and a reset operation voltage source Vreset, respectively. A sense amplifier enabling signal SE, a reference voltage REF, and a data output line D are connected to the sense amplifier SA.

In the present embodiment, programming/reading operations will be explained with reference to FIG. 34. As one example, an operation of the memory cell MC00 will be described. Operations of the other memory cells are conducted similarly.

The reset operation (RESET) is performed in the following manner. The read switch RSW and the set switch SS-SW are put in OFF state. First, the reset switch RS-SW and the programming ground switch WG-SW are turned ON. The memory cell MC00 is selected by the X-system address decoder X-DEC and the Y-system address decoder Y-DEC so that current larger than set current described later is caused to flow in the memory cell MC00. After the current is caused to flow for a fixed period of time, the word line WL0 and the bit line BL0 are caused to fall down. Thereby, the memory element R00 is rapidly cooled from a melted state to become amorphous.

The set operation (SET) is performed in the following manner. The read switch RSW and the reset switch RS-SW are put in OFF state. First, the set switch SS-SW and the programming ground switch WG-SW are turned ON. The memory cell MC00 is selected by the X-system address decoder X-DEC and the Y-system address decoder Y-DEC so that current smaller than for the abovementioned reset operation is caused to flow in the memory cell MC00. After current is caused to flow for a period of time longer than that in the abovementioned reset operation, the word line WL0 and the bit line BL0 are caused to fall down. Thereby, the memory element R00 is crystallized.

Since programming is performed in a current direction where the state of the memory element easily changes in the set operation, information in the memory element is easily rewritten. The reset operation is performed by causing current to flow in a direction in which the source potential of the NMOSFET can be made equal to that of the source line and voltage between the gate and the source of the NMOSFET can be made large, that is, from the bit line to the source line through the memory cell.

The read operation (READ) is performed in the following manner. The reset switch RS-SW, the programming ground switch WG-SW, and the set switch SS-SW are turned OFF. First, the read switch RSW is turned ON. After a predetermined period of time, the read switch RSW is turned OFF. Current corresponding to a resistance value of the memory element R00 flows in the memory element R00 so that the bit line is charged. That is, when the memory element R00 is in a low resistance, the bit line BL0 is charged to a voltage higher than that at the time when the bit line BL0 is in the high resistance. By turning the sense amplifier enabling signal SE ON, the potential difference is amplified by the sense amplifier SA, so that data can be obtained from the data output line D.

Unlike the set operation, since reading is performed in the read operation by causing current to flow in a direction in which the state of the memory element hardly changes, information in the memory element is hardly destroyed.

The current amount required for the operation depends on the characteristics of the memory element. For explanation, specific numerical examples are described below. For example, when the reset current is 200 μA (micro ampere), the chalcogenide can be melted. The pulse width of this reset current is 50 ns (nanoseconds). For example, when the set current is 100 μA, the temperature of the chalcogenide can be raised to the crystallization temperature or higher. The pulse width of the set current is 150 ns. When such a configuration is adopted that, when the memory cell is in the set state, for example, the read current of 60 μA flows, the reading operation can be performed with a practical speed. Such setting can be performed that, when the memory cell is in the reset state, for example, the read current is only 1 μA. The pulse width of the read current is 10 ns.

Effect of Embodiments

According to the respective embodiments described above, a semiconductor device which can perform high-speed reading and has high data retention characteristics, especially, a semiconductor nonvolatile memory can be realized. Further, the semiconductor nonvolatile memory can provide a logic embedded type memory such as a high-functional, incorporated-type microcomputer with high reliability or a semiconductor device including an analog circuit by mounting the semiconductor nonvolatile memory and a logic circuit such as a CPU on the same substrate in a mixing manner. The semiconductor nonvolatile memory can also be provided as a stand-alone memory.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

A technique for realizing stable programming of a phase-change memory according to the present invention widely contributes practical use of the phase-change memory and, especially, such a possibility that the phase-change memory can be widely used in a nonvolatile-memory embedded Memory microcomputer, an IC card or the like is considerably high. That is, according to significant spreading of mobile devices, demand for non-volatile memories increases. Especially, such a memory to be embedded with a logic circuit is easy, high-speed programming can be performed, the number of writable times is large, and driving voltage is low is demanded. The phase-change memory can be utilized as a memory having all the features described above.

What is claimed is:

1. A semiconductor device including a memory array comprising a plurality of memory cells provided at intersecting points of a plurality of word lines and a plurality of bit lines intersecting the plurality of word lines via an insulating layer, each memory cell including an information memory section and a select element, wherein
when programming of information is performed by a first pulse which programs information flowing in the bit line and a second pulse different from the first pulse and information is read by a third pulse, current directions of the second pulse and the third pulse are opposite to each other.

2. The semiconductor device according to claim 1, wherein the select element is a MISFET.

3. The semiconductor device according to claim 1, wherein the select element is a bipolar-type transistor.

4. The semiconductor device according to claim 1, wherein the select element is a junction.

5. The semiconductor device according to claim 1, wherein the first pulse, the second pulse, and the third pulse are different in pulse width from one another,
the second pulse has the longest pulse width, and
the third pulse has the shortest pulse width.

6. The semiconductor device according to claim 1, wherein voltage of the third pulse is higher than that of the first pulse or the second pulse.

7. The semiconductor device according to claim 1, wherein an amount of current of the third pulse is more than that of the first pulse or the second pulse.

8. The semiconductor device according to claim 1, further comprising a CPU.

* * * * *